US011778831B2

(12) United States Patent
Lee

(10) Patent No.: US 11,778,831 B2
(45) Date of Patent: Oct. 3, 2023

(54) MANUFACTURING METHOD OF SEMICONDUCTOR MEMORY DEVICE

(71) Applicant: SK hynix Inc., Icheon-si Gyeonggi-do (KR)

(72) Inventor: Nam Jae Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 247 days.

(21) Appl. No.: 17/223,448

(22) Filed: Apr. 6, 2021

(65) Prior Publication Data

US 2022/0108994 A1 Apr. 7, 2022

(30) Foreign Application Priority Data

Oct. 7, 2020 (KR) .................. 10-2020-0129527

(51) Int. Cl.
| | | |
|---|---|---|
| H10B 43/35 | (2023.01) | |
| H01L 23/535 | (2006.01) | |
| H01L 23/522 | (2006.01) | |
| H01L 21/3213 | (2006.01) | |
| H10B 41/27 | (2023.01) | |
| H10B 41/35 | (2023.01) | |
| H10B 41/41 | (2023.01) | |
| H10B 43/27 | (2023.01) | |
| H10B 43/40 | (2023.01) | |

(52) U.S. Cl.
CPC ....... *H10B 43/35* (2023.02); *H01L 21/32133* (2013.01); *H01L 21/32139* (2013.01); *H01L 23/5225* (2013.01); *H01L 23/5226* (2013.01); *H01L 23/535* (2013.01); *H10B 41/27* (2023.02); *H10B 41/35* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 10,629,616 B1 | 4/2020 | Kai et al. | |
| 2020/0091167 A1 * | 3/2020 | Lee | ........................ H10B 41/27 |

FOREIGN PATENT DOCUMENTS

| | | |
|---|---|---|
| KR | 1020180137272 A | 12/2018 |
| KR | 1020200033067 A | 3/2020 |

* cited by examiner

*Primary Examiner* — Hsien Ming Lee
(74) *Attorney, Agent, or Firm* — WILLIAM PARK & ASSOCIATES LTD.

(57) ABSTRACT

A method of manufacturing a semiconductor memory device includes: forming a preliminary memory cell array on a support structure, the preliminary memory cell array with a stack structure and cell pillars; removing the support structure to expose a portion of each of the cell pillars; forming a protective layer that covers the exposed portion of each of the cell pillars; forming a mask pattern that exposes an opening defined between inclined surfaces of the protective layer wherein the inclined surfaces are disposed between the cell pillars; and etching at least one conductive layer among the conductive layers that is adjacent to the opening, thereby isolating the at least one conductive layer into select lines.

17 Claims, 28 Drawing Sheets

MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2020-0129527, filed on Oct. 7, 2020, in the Korean Intellectual Property Office, the entire disclosure of which is incorporated herein by reference.

BACKGROUND

1. Technical Field

The present disclosure may generally relate to a manufacturing method of a semiconductor memory device, and more particularly, to a manufacturing method of a three-dimensional semiconductor memory device.

RELATED ART

A semiconductor memory device includes a plurality of memory cells capable of storing data. The memory cells may be three-dimensionally arranged to implement a three-dimensional semiconductor memory device. The memory cells may constitute a plurality of memory cell strings. The memory cell strings may be connected to word lines and select lines.

SUMMARY

In an embodiment of the present disclosure, there may be provided a method of manufacturing a semiconductor memory device, the method including: forming a preliminary memory cell array on a support structure, the preliminary memory cell array with a stack structure and cell pillars; removing the support structure to expose a portion of each of the cell pillars; forming a protective layer that covers the exposed portion of each of the cell pillars; forming a mask pattern that exposes an opening defined between inclined surfaces of the protective layer, wherein the inclined surfaces are disposed between the cell pillars; and etching at least one conductive layer among the conductive layers that is adjacent to the opening, thereby isolating the at least one conductive layer into select lines.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
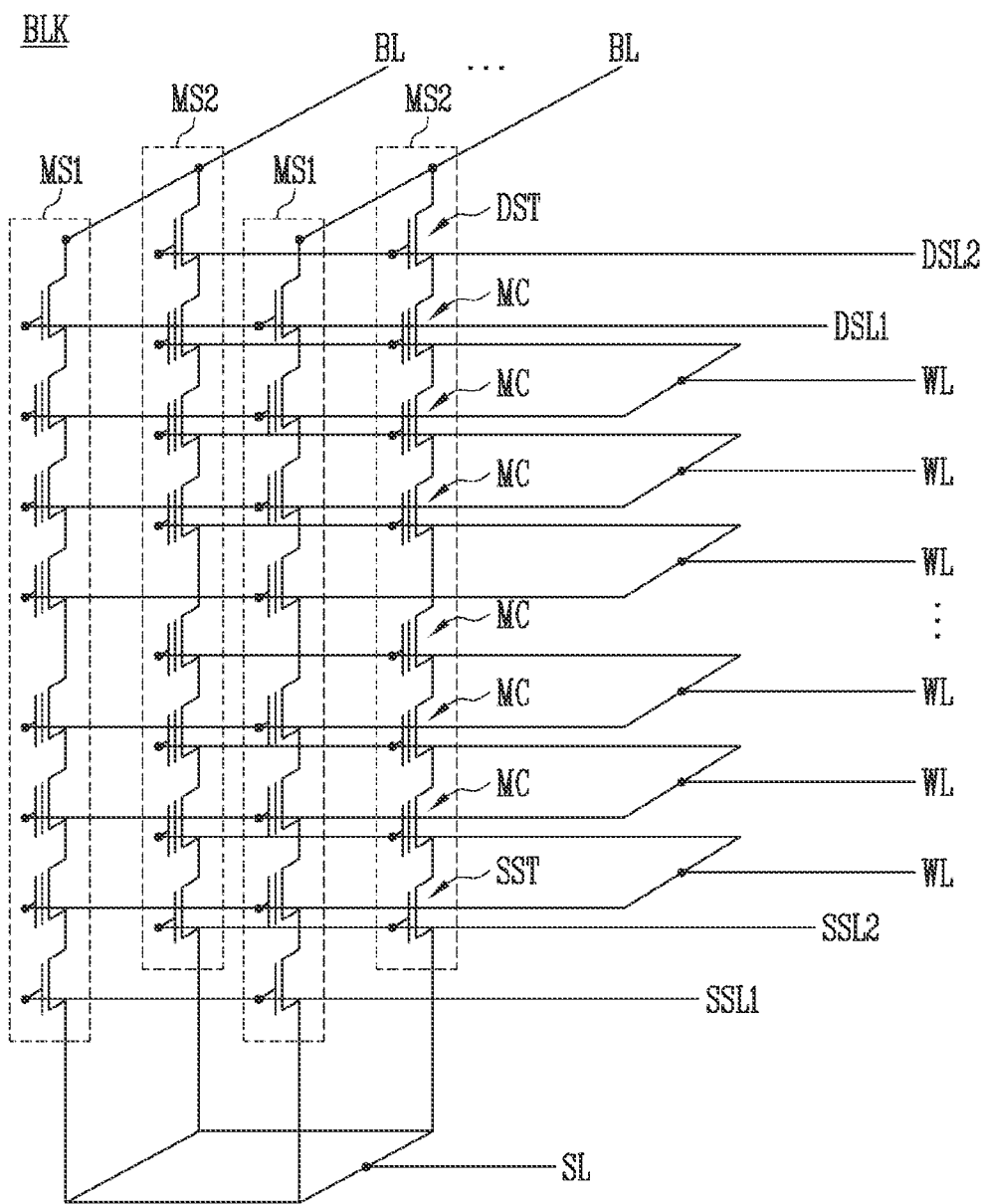
FIG. 1 is a circuit diagram illustrating a memory block of a semiconductor memory device in accordance with an embodiment of the present disclosure.

Specific structural or functional descriptions disclosed herein are merely illustrative for the purpose of describing embodiments according to the concept of the present disclosure. The embodiments according to the concept of the present disclosure can be implemented in various forms, and should not be construed as limited to the specific embodiments set forth herein.

Hereinafter, the terms 'first' and 'second' are used to distinguish one component from another component. The terms may be used to describe various components, but the components are not limited by the terms. Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Embodiments may provide a manufacturing method of a semiconductor memory device, which can improve operational characteristics of the semiconductor memory device.

FIG. 1 is a circuit diagram illustrating a memory block BLK of a semiconductor memory device in accordance with an embodiment of the present disclosure.

Referring to FIG. 1, the semiconductor memory device may include the memory block BLK. The memory block BLK may include a plurality of memory cell strings MS1 and MS2 that are connected to a source layer SL and a plurality of bit lines BL.

Each of the memory cell strings MS1 and MS2 may include a plurality of memory cells MC that are connected in series, at least one source select transistor SST, and at least one drain select transistor DST. In an embodiment, each of the memory cell strings MS1 and MS2 may include one source select transistor SST that is connected between the plurality of memory cells MC and the source layer SL. In another embodiment, each of the memory cell strings MS1 and MS2 may include two or more source select transistors SST that are connected in series between the plurality of memory cells MC and the source layer SL. In an embodiment, each of the memory cell strings MS1 and MS2 may include one drain select transistor DST that is connected between the plurality of memory cells MC and a bit line BL. In another embodiment, each of the memory cell strings MS1 and MS2 may include two or more drain select transistors DST that are connected in series between the plurality of memory cells MC and the bit line BL.

The plurality of memory cells MC may be connected to the source layer SL via the source select transistor SST. The plurality of memory cells MC may be connected to the bit line BL via the drain select transistor DST.

Gates of source select transistors SST that are disposed at the same level may be connected to source select lines SSL1 and SSL2 isolated from each other. Gates of drain select transistors DST that are disposed at the same level may be connected to drain select lines DSL1 and DSL2 that are isolated from each other. Gates of the memory cells MC may be respectively connected to a plurality of word lines WL. The word lines WL may be disposed at different levels, and gates of memory cells MC that are disposed at the same level may be connected to a single word line WL.

The memory block BLK with a first source select line SSL1 and a second source select line SSL2 that are isolated from each other at the same level and a first drain select line DSL1 and a second drain select line DSL2 that are isolated from each other at the same level is exemplified in the drawing. However, the present disclosure is not limited thereto. In an embodiment, the memory block BLK may include three or more source select lines that are isolated from one another at the same level. Similarly, the memory block BLK may include three or more drain select lines that are isolated from one another at the same level.

The plurality of memory cell strings MS1 and MS2 may be connected to each of the word lines WL. The plurality of memory cell strings MS1 and MS2 may include a first group and a second group, which can be individually selected by the first source select line SSL1 and the second source select line SSL2. The first group may include first memory cell strings MS1, and the second group may include second memory cell strings MS2.

Memory cells MC of the first memory cell strings MS1 may be respectively connected to the bit lines BL via drain select transistors DST that are connected to first drain select lines DSL1. Memory cells MC of the second memory cell strings MS2 may be respectively connected to the bit lines BL via drain select transistor DST that is connected to second drain select lines DSL2. One of the first memory cell strings MS1 and one of the second memory cell strings MS2 may be connected to a single bit line BL.

The memory cells MC of the first memory cell strings MS1 may be connected to the source layer SL based on a gate signal applied to the first source select line SSL. The memory cells MC of the second memory cell strings MS2 may be connected to the source layer SL based on a gate signal applied to the second source select line SSL2. Accordingly, the plurality of memory cell strings MS1 and MS2 may be isolated into groups that can be individually and simultaneously selected for each of the source select lines SSL1 and SSL2 in a read operation or a verify operation. In an embodiment, in the read operation or the verify operation, one of the first source select line SSL1 and a second source select line SSL2 may be selected so that one group of the first group of the first memory cell strings MS1 and the second group of the second memory cell strings MS2 may be connected to the source layer SL. Accordingly, in the embodiment of the present disclosure, channel resistance may be reduced as compared with a case in which the first memory cell strings MS1 and the second memory cell strings MS2 are simultaneously connected to the source layer SL in the read operation or the verify operation. Thus, in the embodiment of the present disclosure, read disturb may be reduced.

Figure 2A:
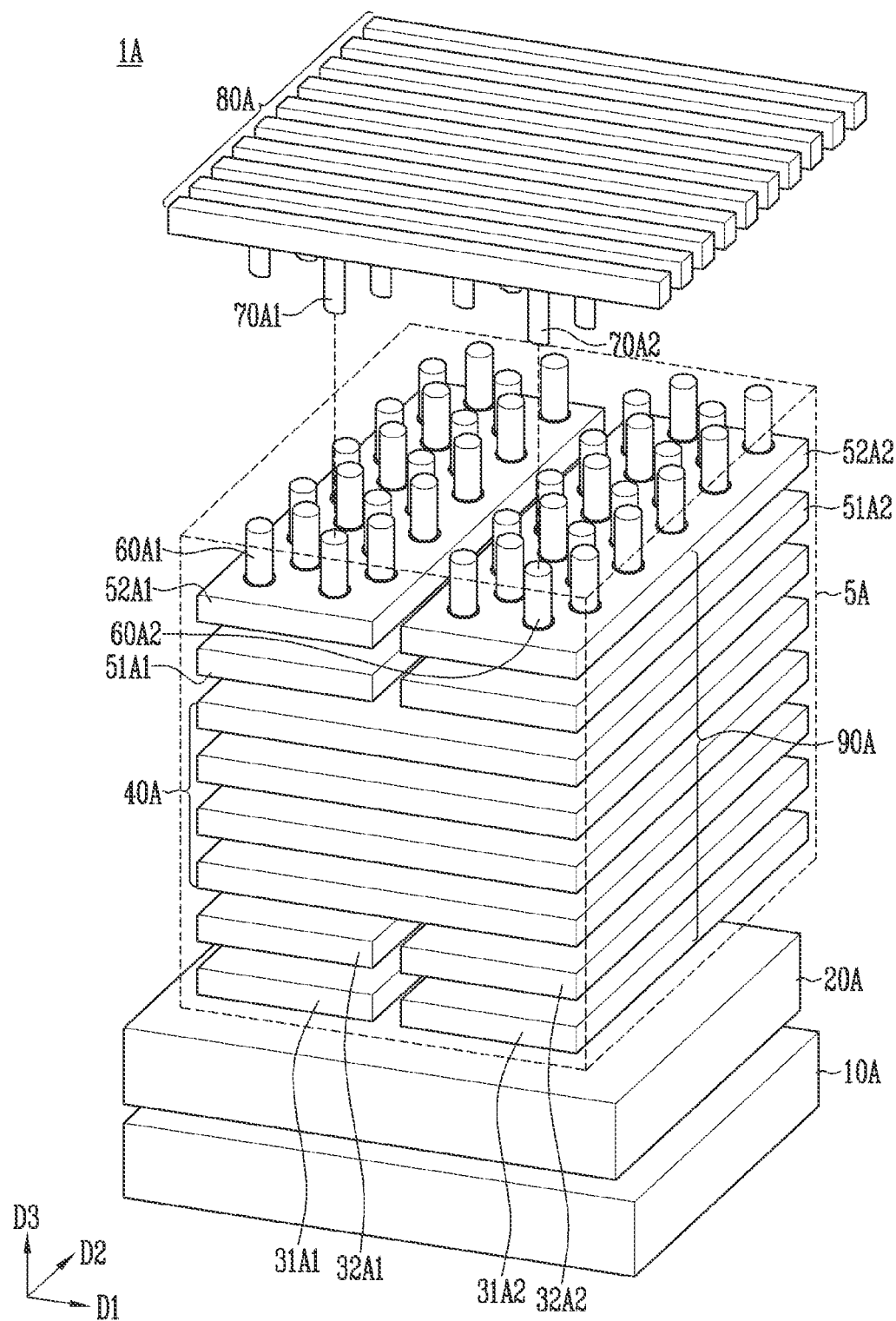
FIGS. 2A and 2B are perspective views illustrating semiconductor memory devices in accordance with embodiments of the present disclosure.
Figure 2B:
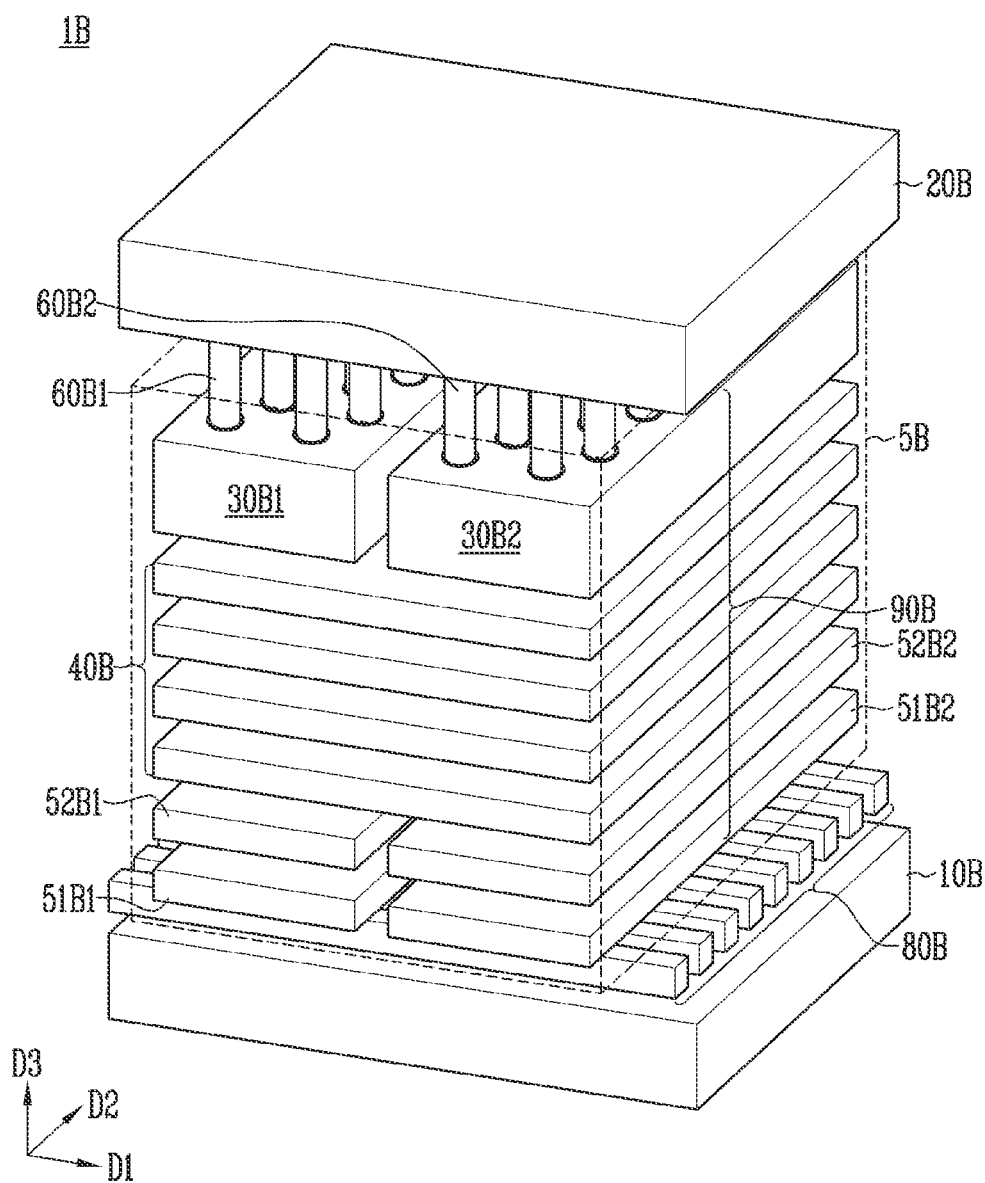

FIGS. 2A and 2B are perspective views illustrating semiconductor memory devices 1A and 1B in accordance with embodiments of the present disclosure. FIGS. 2A and 2B illustrate a portion of a configuration of each of the semiconductor memory devices 1A and 1B to help with the understanding of the structure of each of the semiconductor memory devices 1A and 1B.

Referring to FIGS. 2A and 2B, each of the semiconductor memory devices 1A and 1B may include a peripheral circuit structure 10A or 10B, a memory cell array 5A or 5B, a source layer 20A or 20B, and a plurality of bit lines 80A or 80B.

The peripheral circuit structure 10A or 10B nay include a substrate extending in a first direction D1 and a second direction D2. The peripheral circuit structure 10A or 10B may include a peripheral circuit that controls an operation of the memory cell array 5A or 5B. After the memory cell array 5A or 5B is manufactured, a structure with the memory cell array 5A or 5B may be bonded to the peripheral circuit structure 10A or 10B. Thus, the peripheral circuit structure 10A or 10B may be prevented from being damaged by heat that is generated while the memory cell array 5A or 5B is being manufactured. Accordingly, the operational characteristic degradation of the peripheral circuit structure 10A or 10B may be reduced.

The memory cell array 5A or may overlap with the peripheral circuit structure 10A or 10B. The memory cell array 5A or 5B may be disposed between the source layer 20A or 20B and the plurality of bit lines 80A or 80B.

A direction, perpendicular to a plane that extends in the first direction D1 and the second direction D2, is defined as a third direction D3. The arrangement of the memory cell array 5A or 5B, the source layer 20A or 20B, and the plurality of bit lines 80A or 80B in the third direction D3 may vary.

Referring to FIG. 2A, the memory cell array 5A may overlap with the peripheral circuit structure 10A, the source layer 20A being interposed therebetween. The plurality of bit lines 80A may overlap with the peripheral circuit structure 10A, the source layer 20A, and the memory cell array 5A, the source layer 20A and the memory cell array 5A being interposed between the plurality of bit lines 80A and the peripheral circuit structure 10A.

The memory cell array 5A may include channel structures 60A1 and 60A2 and a gate stack structure 90A that surrounds the channel structures 60A1 and 60A2.

The gate stack structure 90A may include source select lines 31A1, 31A2, 32A1, and 32A2, word lines 40A, and drain select lines 51A1, 51A2, 52A1, and 52A2. The source select lines 31A1, 31A2, 32A1, and 32A2, the word lines 40A, and the drain select lines 51A1, 51A2, 52A1, and 52A2 may be disposed to be spaced apart from each other. Conductive materials that constitute the source select lines 31A1, 31A2, 32A1, and 32A2, the word lines 40A, and the drain select lines 51A1, 51A2, 52A1, and 52A2 may vary. In an embodiment, the source select lines 31A1, 31A2, 32A1, and 32A2 and the drain select lines 51A1, 51A2, 52A1, and 52A2 may be formed of the same conductive material as the word lines 40A. However; the present disclosure is not limited thereto. In another embodiment, the source select lines 31A1, 31A2, 32A1, and 32A2 or the drain select lines 51A1, 51A2, 52A1, and 52A2 may be formed of a conductive material that is different from that constituting the word lines 40A.

The source select lines 31A1, 31A2, 32A1, and 32A2 may be disposed between the source layer 20A and the plurality of bit lines 80A. The source select lines 31A1, 31A2, 32A1, and 32A2 may include at least one first source select line and at least one second source select line. In an embodiment, the source select lines 31A1, 31A2, 32A1, and 32A2 may include two first source select lines 31A1 and 32A1 and two second source select lines 31A2 and 32A2. The first source select lines 31A1 and 32A1 may include a first source select line 31A1 of a first level and a first source select line 32A1 of a second level, which are spaced apart from each other in the third direction D3. The second source select lines 31A2 and 32A2 may include a second source select line 31A2 of the first level and a second source select line 32A2 of the second level, which are spaced apart from each other in the third direction D3. The first source select line 31A1 of the first level and the second source select line 31A2 of the first level may be spaced apart from each other in the first direction D1. The first source select line 32A1 of the second level and the second source select line 32A2 of the second level may be spaced apart from each other in the first direction D1.

The drain select lines 51A1, 51A2, 52A1, and 52A2 may be disposed between the source select lines 31A1, 31A2, 32A1, and 32A2 and the plurality of bit lines 80A. The drain select lines 51A1, 51A2, 52A1, and 52A2 may include at least one first drain select line and at least one second drain select line. In an embodiment, the drain select lines 51A1, 51A2, 52A1, and 52A2 may include two first drain select lines 51A1 and 52A1 and two second drain select lines 51A2 and 52A2. The first drain select lines 51A1 and 52A1 may include a first drain select line 51A1 of a third level and a first drain select line 52A1 of a fourth level, which are spaced apart from each other in the third direction D3. The second drain select lines 51A2 and 52A2 may include a second drain select line 51A2 of the third level and a second drain select line 52A2 of the fourth level, which are spaced apart from each other in the third direction D3. The first drain select line 51A1 of the third level and the second drain select line 51A2 of the third level may be spaced apart from each other in the first direction D1. The first drain select line 52A1 of the fourth level and the second drain select line 52A2 of the fourth level may be spaced apart from each other in the first direction D1.

Each of the word lines 40A may be disposed between the first source select lines 31A1 and 32A1 and the first drain select lines 51A1 and 52A1, and may extend between the second source select lines 31A2 and 32A2 and the second drain select lines 51A2 and 52A2. The word lines 40A may be stacked to be spaced apart from each other in the third direction D3.

The channel structures 60A1 and 60A2 may include a channel layer that is used as a channel region of the memory cell strings MS1 and MS2, shown in FIG. 1. The channel structures 60A1 and 60A2 may be in contact with the source layer 20A. The channel structures 60A1 and 60A2 may penetrate the gate stack structure 90A and may extend toward the bit lines 80A. The channel structures 60A1 and 60A2 may be connected to the bit lines 80A via bit line contacts 70A1 and 70A2.

The channel structures 60A1 and 60A2 may include a first channel structure 60A1 that is controlled by the first source select lines 31A1 and 32A1 and a second channel structure 60A2 that is controlled by the second source select lines 31A2 and 32A2. The first channel structure 60A1 may penetrate the first drain select lines 51A1 and 52A1, the word lines 40A, and the first source select lines 31A1 and 32A1, and may be in contact with the source layer 20A. The second channel structure 60A2 may penetrate the second drain select lines 51A2 and 52A2, the word lines 40A, and the second source select lines 31A2 and 32A2, and may be in contact with the source layer 20A. Each of the word lines 40A may extend to surround the first channel structure 60A1 and the second channel structure 60A2. Accordingly, the first channel structure 60A1 and the second channel structure 60A2 may be simultaneously controlled by one word line 40A.

The bit line contacts 70A1 and 70A2 may include a first bit line contact 70A1 that is in contact with the first channel structure 60A1 and a second bit line contact 70A2 that is in contact with the second channel structure 60A2. One bit line 80A may be simultaneously connected to one first channel structure 60A1 and one second channel structure 60A2 via a pair of first and second bit line contacts 70A1 and 70A2.

Referring to FIG. 2B, the memory cell array 5B may overlap with the peripheral circuit structure 10B, the plurality of bit lines 80B being interposed therebetween. The source layer 20B may overlap with the peripheral circuit structure 10B, the plurality of bit lines 80B, and the memory cell array 5B, the plurality of bit lines 80B and the memory cell array 5B being interposed between the source layer 20B and the peripheral circuit structure 10B.

The memory cell array 5b may include channel structures 60B1 and 60B2 and a gate stack structure 90B that surrounds the channel structures 60B1 and 60B2.

The gate stack structure 90B may include source select lines 30B1 and 30B2, word lines 40B, and drain select lines 51B1, 51B2, 52B1, and 52B2. Conductive materials that constitute the source select lines 30B1 and 30B2, the word lines 40B, and the drain select lines 51B1, 51B2, 52B1, and 52B2 may vary. Hereinafter, detailed descriptions of components that overlap with those that are shown in FIG. 2A will be omitted.

The drain select lines 51B1, 51B2, 52B1, and 52B2 may be disposed between the plurality of bit lines 80B and the source layer 20B. In an embodiment, the drain select lines 51B1, 51B2, 52B1, and 52B2 may include two first drain select lines 51B1 and 52B1 and two second drain select lines 51B2 and 52B2. The first drain select lines 51B1 and 52B1 may include a first drain select line 51B1 of a first level and a first drain select line 52B1 of a second level, which are spaced apart from each other in the third direction D3. The second drain select lines 51B2 and 52B2 may include a second drain select line 51B2 of the first level and a second drain select line 52B2 of the second level, which are spaced apart from each other in the third direction D3. The first drain select line 51B1 of the first level and the second drain select line 51B2 of the first level may be spaced apart from each other in the first direction D1. The first drain select line 52B1 of the second level and the second drain select line 52B2 of the second level may be spaced apart from each other in the first direction D1.

The source select lines 30B1 and 30B2 may be disposed between the drain select lines 51B1, 51B2, 52B1, and 52B2 and the source layer 20B. In an embodiment, a conductive layer of a third level may be isolated into line patterns so that a first source select line 30B1 and a second source select line 30B2 may be defined.

Similar to what has been described with reference to FIG. 2A, the channel structures 60B1 and 60B2 may include a first channel structure 60B1 and a second channel structure 60B2, which can be simultaneously controlled by one bit line 80B.

Figure 3A:
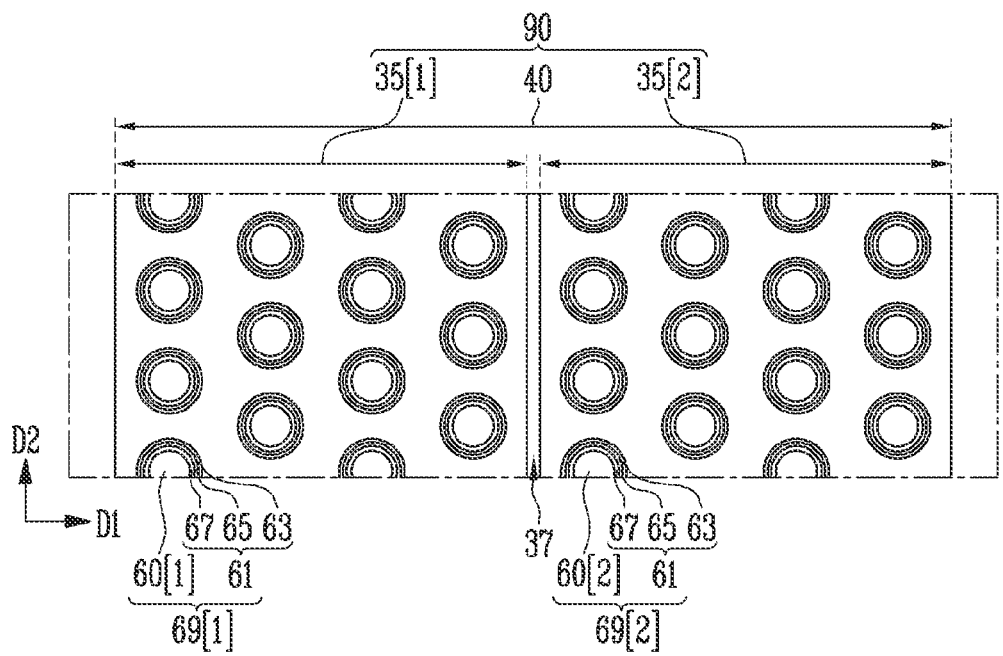
FIG. 3A illustrates a layout of a gate stack structure and channel structures of a semiconductor memory device in accordance with an embodiment of the present disclosure.
Figure 3B:
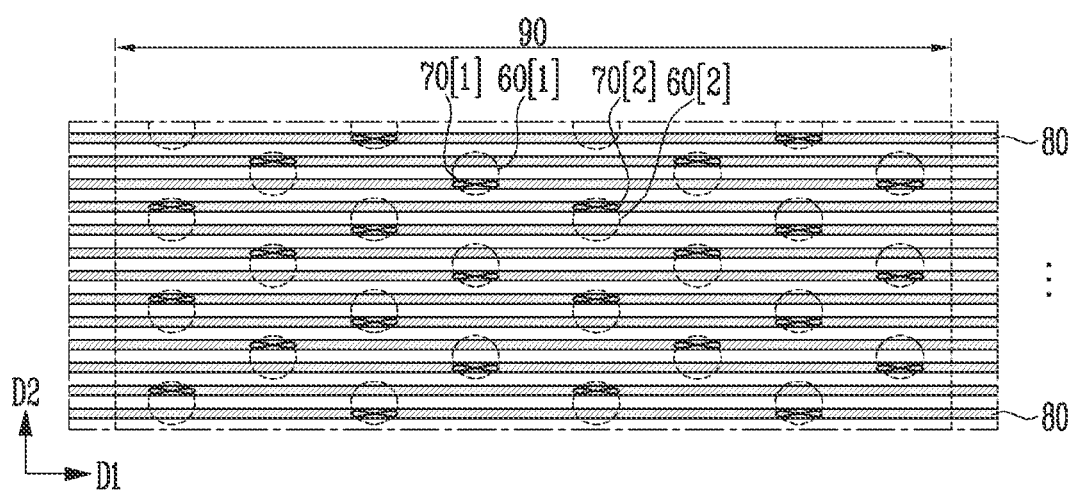
FIG. 3B illustrates a layout of bit lines.

FIG. 3A illustrates a layout of a gate stack structure 90 and channel structures 60[1] and 60[2] of a semiconductor memory device in accordance with an embodiment of the present disclosure, and FIG. 3B illustrates a layout of bit lines 80. The layout of the gate stack structure 90 and the channel structures 60[1] and 60[2], which are shown in FIG. 3A, and the layout of the bit lines 80, shown in FIG. 3B, may be applied to the semiconductor memory device 1A, shown in FIG. 2A, or the semiconductor memory device 1B, shown in FIG. 2B.

Referring to FIG. 3A, the gate stack structure 90 may surround a first channel structure 60[1] and a second channel structure 60[2]. A memory layer 61 may be disposed between the gate stack structure 90 and each of the first channel structure 60[1] and the second channel structure 60[2].

The memory layer 61 may include a tunnel insulating layer 67 that surrounds each of the first channel structure 60[1] and the second channel structure 60[2], a data storage layer 65 that surrounds the tunnel insulating layer 67, and a blocking insulating layer 63 that surrounds the data storage layer 65. The data storage layer 65 may be formed as a material layer that is capable of storing data. In an embodiment, the data storage layer 65 may be formed as a material layer that is capable of storing data, changed through Fowler-Nordheim tunneling. The material layer may include a nitride layer in which charges can be trapped. The blocking insulating layer 63 may include an oxide layer that is capable of blocking charges. The tunnel insulating layer 67 may be formed as a silicon oxide layer through which charges can tunnel.

The first channel structure 60[1] and the memory layer 61 that surrounds the first channel structure 60[1] may constitute a first cell pillar 69[1]. The second channel structure 60[2] and the memory layer 61 that surrounds the second channel structure 60[2] may constitute a second cell pillar 69[2]. A plurality of first cell pillars 69[1] and a plurality of second cell pillars 69[2] may penetrate the gate stack structure 90. The plurality of first cell pillars 69[1] and the plurality of second cell pillars 69[2] may be variously arranged on a plane that extends in the first direction D1 and the second direction D2. In an embodiment, the first cell pillars 69[1] and the second cell pillars 69[2] may constitute a zigzag arrangement to improve the arrangement density of memory cell strings.

A first select line 35[1] and a second select line 35[2] of the gate stack structure 90 may be arranged to be spaced apart from each other in the first direction D1. Each of the first select line 35[1] and the second select line 35[2] may extend in the second direction D2. A layout of the first select line 35[1] and the second select line 35[2] may be applied to the first source select line 31A1 of the first level and the second source select line 31A2 of the first level, which are shown in FIG. 2A, and applied to the first source select line 32A1 of the second level and the second source select line 32A2 of the second level, which are shown in FIG. 2A. The layout of the first select line 35[1] and the second select line 35[2] may be applied to the first source select line 30B1 and the second source select line 30B2, which are shown in FIG. 2B. The layout of the first select line 35[1] and the second select line 35[2] may be applied to the first drain select line 51A1 of the third level and the second drain select line 51A2 of the third level, which are shown in FIG. 2A, and applied to the first drain select line 52A1 of the fourth level and the second drain select line 52A2 of the fourth level, which are shown in FIG. 2A. The layout of the first select line 35[1] and the second select line 35[2] may be applied to the first drain select line 51B1 of the first level and the second drain select line 51B2 of the first level, which are shown in FIG. 2B, and applied to the first drain select line 52B1 of the second level and the second drain select line 52B2 of the second level, which are shown in FIG. 2B.

The first select line 35[1] and the second select line 35[2] may be spaced apart from each other by a slit 37. The slit 37 may overlap with a word line 40 of the gate stack structure 90.

The first cell pillars 69[1] may include a slit-side first cell pillar that is adjacent to the slit 37, and the second cell pillars 69[2] may include a slit-side second cell pillar that is adjacent to the slit 37. When a width of the slit is formed too wide or when a position of the slit is changed based on a process error, a sidewall of the slit-side first cell pillar and a sidewall of the slit-side second cell pillar may be exposed by the slit. In an embodiment of the present disclosure, a process of forming the slit 37 may be controlled such that the sidewall of the slit-side first cell pillar and the sidewall of the slit-side second cell pillar are not exposed. The process of forming the slit 37 may be performed through an embodiment, shown in FIGS. 5G to 5I, or may be performed through an embodiment, shown in FIG. 7E. Through the process of forming the slit 37 in accordance with the embodiment of the present disclosure, the first select line 35[1] may remain to surround the sidewall of the slit-side first cell pillar, and the second select line 35[2] may remain to surround the sidewall of the slit-side second cell pillar. Accordingly, in accordance with the embodiment of the present disclosure, select transistors with a gate all around (GAA) structure may be defined at an intersection portion of the slit-side first cell pillar and the first select line 35[1] and an intersection portion of the slit-side second cell pillar and the second select line 35[2].

Referring to FIG. 3B, the bit lines 80 may overlap with the gate stack structure 90. Each of the bit lines 80 may be simultaneously connected to one first channel structure 60[1] and one second channel structure 60[2] via a pair of first and second bit line contacts 70[1] and 70[2]. A layout of the first and second bit line contacts 70[1] and 70[2] may vary based on the bit lines 80 and the first cannel structure 60[1] and the second channel structure 60[2].

Hereinafter, a manufacturing method of a semiconductor memory device that is capable of allowing a slit between select lines to be self-aligned between cell pillars will be described.

Figure 4:
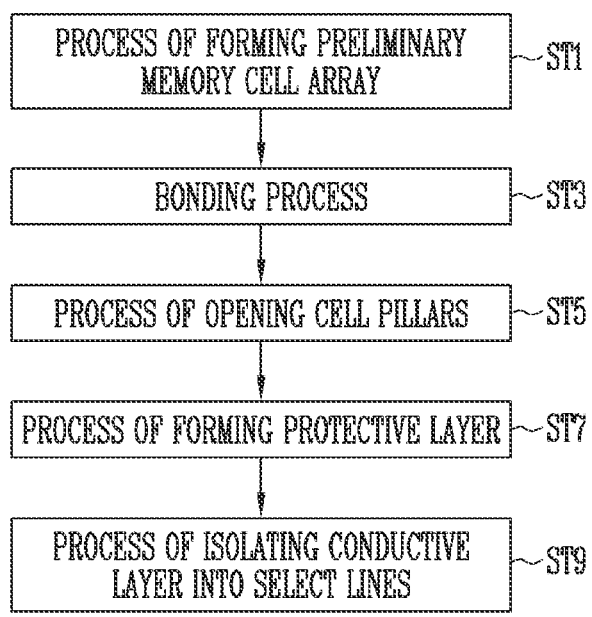
FIG. 4 is a flowchart schematically illustrating a manufacturing method of a semiconductor memory device in accordance with an embodiment of the present disclosure.

FIG. 4 is a flowchart schematically illustrating a manufacturing method of a semiconductor memory device in accordance with an embodiment of the present disclosure.

Referring to FIG. 4, a preliminary memory cell array may be provided through a process ST1 of forming the preliminary memory cell array. The preliminary memory cell array may include conductive layers and interlayer insulating layers, which are alternately stacked on a support structure. At least one conductive layer among the conductive layers that is adjacent to the support structure may constitute select lines.

After the preliminary memory cell array is formed, a peripheral circuit may be bonded through a bonding process ST3. The bonding process ST3 may be performed in a state in which the at least one conductive layer that is adjacent to the support structure is not isolated into the select lines.

After the bonding process ST3 is performed, a process ST5 of opening cell pillars may be performed. The cell pillars may be opened by removing the support structure. The opened cell pillars may provide an uneven structure.

After the process ST5 of opening the cell pillars is performed, a process ST7 of forming a protective layer may be performed. The protective layer may be deposited to cover the uneven structure that is provided by the cell pillars. The protective layer may be deposited under a condition in which step coverage is poor. In an embodiment, the protective layer may be deposited through Physical Vapor Deposition (PVD) or Chemical Vapor Deposition (CVD), which has step coverage that is poorer than that of Atomic Layer Deposition (ALD). The protective layer may include a material with etch selectivity with respect to the interlayer insulating layers and the conductive layers of the preliminary memory cell array. In an embodiment, the protective layer may include an amorphous carbon layer (ACL). The ACL may be deposited through Plasma Enhanced-Chemical Vapor Deposition (PE-CVD).

The protective layer that is deposited under the condition in which the step coverage is poor may be formed relatively thick on a convex part of the uneven structure as compared to a concave part of the uneven structure and may have an overhang structure.

After the process ST7 of forming the protective layer is performed, a process ST9 of isolating the conductive layer into select lines may be performed. A mask pattern may be formed on the protective layer by using a photolithography process. Subsequently, an etching process of the conductive layer by using the mask pattern as an etch barrier may be performed so that the conductive layer may be isolated into the select lines. Although the protective layer is etched, the protective layer may remain on a sidewall of the cell pillar by using the protective layer with different thicknesses based on the positions thereof. Accordingly, a partial region of the conductive layer overlapping with the protective layer may be protected from the etching process. As a result, although the etching process of the conductive layer is performed, the conductive layer that constitutes the select line may remain to surround the sidewall of the cell pillar.

In the following embodiments, the manufacturing method of the semiconductor memory device by using the manufacturing processes described with reference to FIG. 4 will be described in more detail.

FIGS. 5A to 5L are sectional views illustrating a manufacturing method of a semiconductor memory device in accordance with an embodiment of the present disclosure.

Figure 5A:
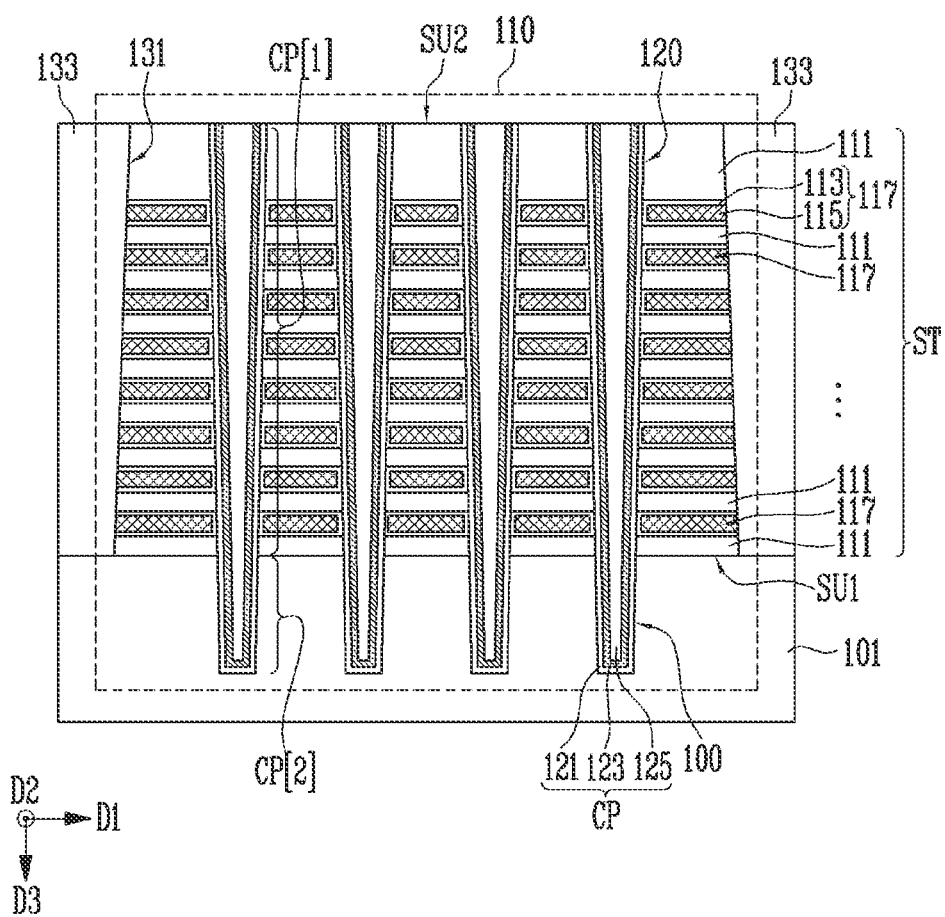
FIGS. 5A to 5L are sectional views illustrating a manufacturing method of a semiconductor memory device in accordance with an embodiment of the present disclosure.

Referring to FIG. 5A, a preliminary memory cell array 110 formed through the process ST1, shown in FIG. 4, may be supported by a support structure 101. The preliminary memory cell array 110 may include a stack structure ST and cell pillars CP.

The stack structure ST may be disposed between vertical insulating layers 133. The stack structure ST may include a first surface SU1 that faces the support structure 101 and a second surface SU2 that faces the opposite direction compared to the first surface SU1. The stack structure ST may include interlayer insulating layers 111 and conductive layer 117, which are alternately stacked on the support structure 101. The interlayer insulating layers 111 and the conductive layers 117 may extend in the first direction D1 and the second direction D2. The interlayer insulating layers 111 and the conductive layers 117 may be disposed at levels that are spaced apart from the support structure 101 at different distances.

Each of the conductive layers 117 may include a single conductive material or two or more different conductive materials. In an embodiment, each of the conductive layers 117 may include a metal barrier layer 113 and a metal layer 115. The metal barrier layer 113 may be disposed between each of the cell pillars CP and the metal layer 115. The metal barrier layer 113 may extend between each of the interlayer insulating layers 111 and the metal layer 115. However, the embodiment of the present disclosure is not limited thereto, and the conductive material of each of the conductive layers 117 may vary.

Each of the cell pillars CP may include a first part CP[1] that penetrates the stack structure ST and a second part CP[2] that extends in the third direction D3 toward the support structure 101 from the first part CP[1]. The second part CP[2] may be inserted into a groove 100 that is formed in the support structure 101. In an embodiment, the support structure 101 may be a silicon substrate with the groove 100.

Each of the cell pillars CP may include a memory layer 121, a channel layer 123, and a core insulating layer 125. The core insulating layer 125 may be disposed in a central region of the cell pillar CP. In other words, the core insulating layer 125 may be disposed in a central region of the first part CP[1] and may extend to a central region of the second part CP[2]. The channel layer 123 may surround a sidewall of the core insulating layer 125 and may extend along a bottom surface of the core insulating layer 125 that faces the third direction D3. The memory layer 121 may extend along an outer wall of the channel layer 123 that faces the support structure 101 and the stack structure ST.

Figure 6A:
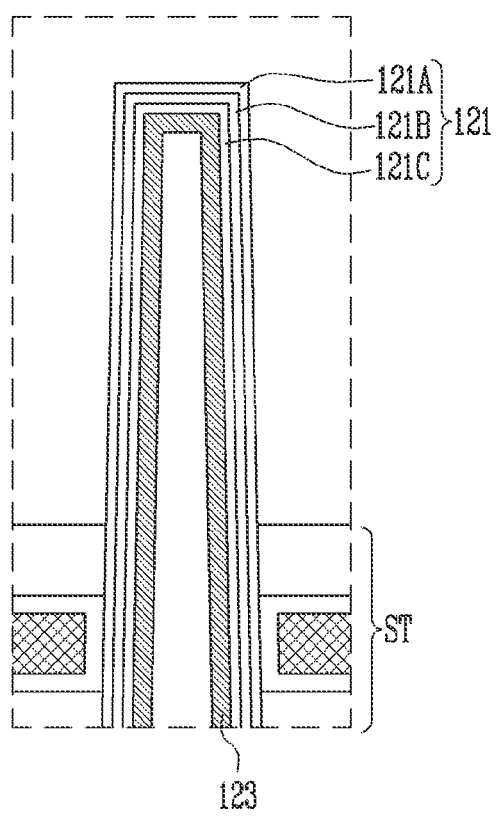
FIGS. 6A to 6C are sectional views illustrating an embodiment of a process of forming an impurity injection region shown in FIG. 5F.

The channel layer 123 may include a semiconductor layer to provide a channel region of each of the memory cell strings MS1 and MS2, shown in FIG. 1. In an embodiment, the channel layer 123 may include silicon. The memory layer 121 may include a blocking insulating layer 121A, a data storage layer 121B, and a tunnel insulating layer 121C, which are shown in FIG. 6A.

The preliminary memory cell array 110 may be formed through various processes. In an embodiment, the process of forming the preliminary memory cell array 110 may include a process of alternately stacking first material layers and second material layers on the support structure 101, a process of forming a hole 120 that penetrates the first material layers and the second material layers, a process of forming the groove 100 by etching the support structure 101 through the hole 120, a process of forming the cell pillar CP that fills the hole 120 and extends into the groove 100, and a process of forming a slit 131 that penetrates the first material layers and the second material layers.

In an embodiment, the first material layers may be the interlayer insulating layers 111, and the second material layers may be selected from materials with an etch selectivity with respect to the interlayer insulating layers 111. In an embodiment, the interlayer insulating layers 111 may include silicon oxide, and a material with an etch selectivity with respect to the silicon oxide may be silicon nitride. The second material layers that are formed of the silicon nitride may be replaced with the conductive layers 117 through the slit 131. After the second material layers are replaced with the conductive layers 117, the slit 131 may be filled with the vertical insulating layer 133.

Figure 5B:
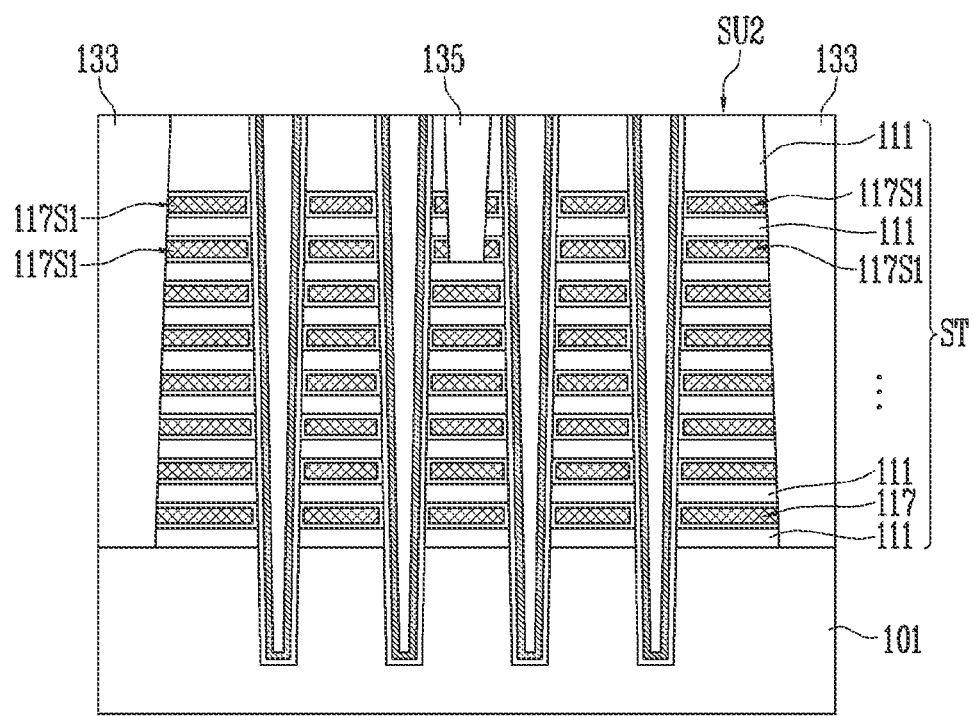
Figure 5B:
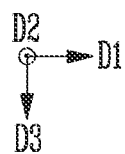

Referring to FIG. 5B, an isolation layer 135 may be formed, which penetrates some of the conductive layers 117, shown in FIG. 5A. The isolation layer 135 may penetrate at least one conductive layer among the conductive layers 117 that is adjacent to the second surface SU2 of the stack structure ST, shown in FIG. 5A. The conductive layer that is penetrated by the isolation layer 135 may be isolated into first select lines 117S1. The isolation layer 135 may extend in the second direction D2 and may be formed of an insulating material. First select lines 117S1 that are disposed at the same level may be insulated from each other by the isolation layer 135.

The first select lines 117S1 may constitute the drain select lines or source select lines. Hereinafter, based on an embodiment in which the first select lines 117S1 constitute source select lines, subsequent processes will be described with reference to FIGS. 5C to 5L, but the present disclosure is not limited thereto.

Figure 5C:
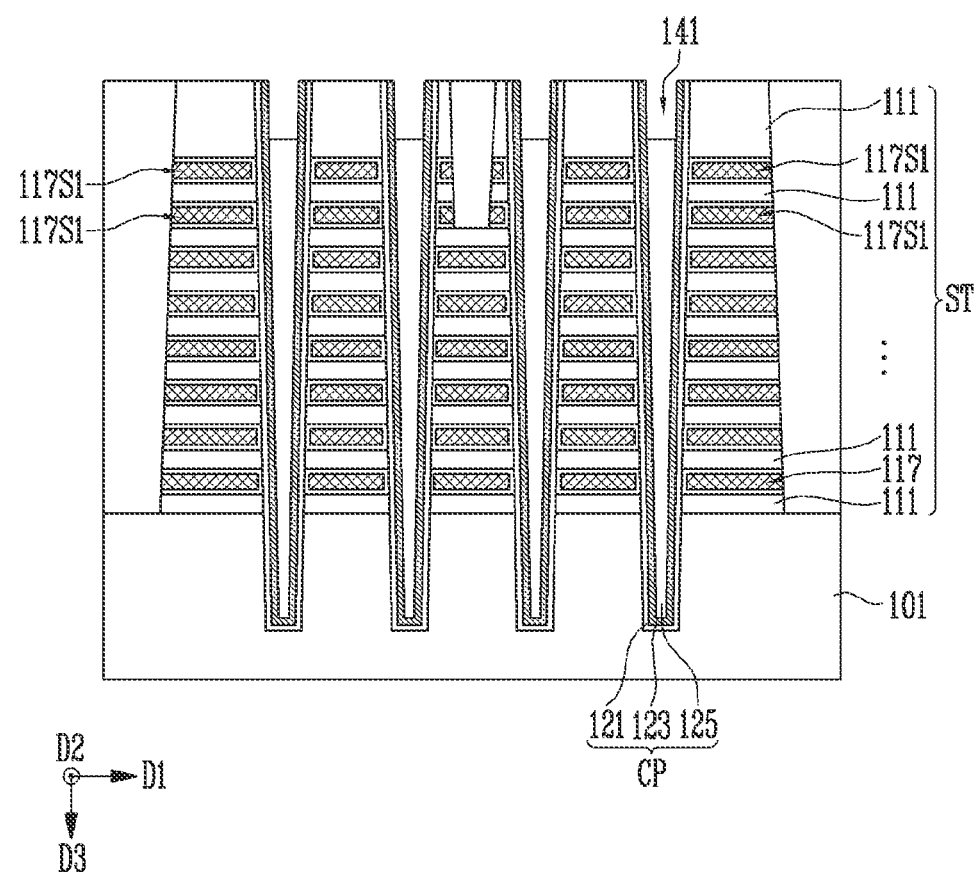

Referring to FIG. 5C, a recess region 141 that exposes a portion of an inner wall of the channel layer 123 may be defined by etching a portion of the core insulating layer 125 of the cell pillar CP.

Figure 5D:
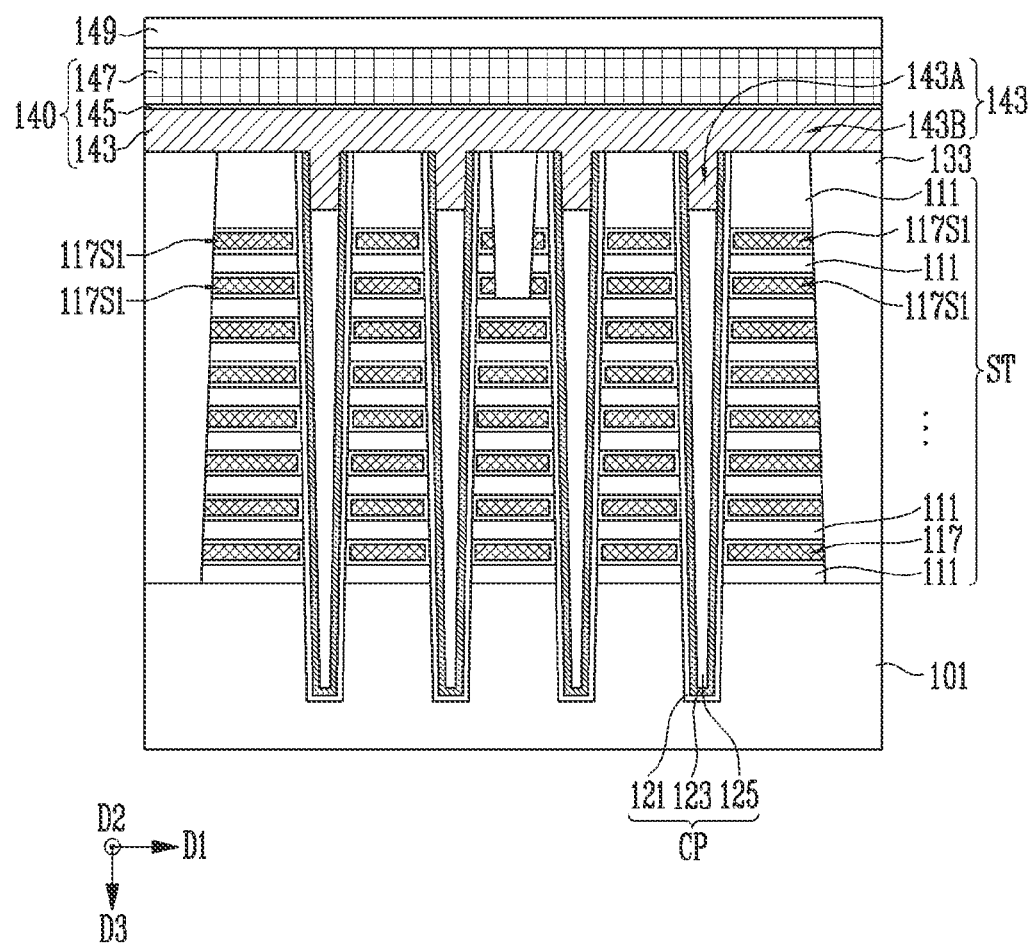

Referring to FIG. 5D, a source layer 140 may be formed, which is connected to the channel layer 123 of the cell pillar CP. In an embodiment, the source layer 140 may include a doped semiconductor layer 143 and a conductive layer with a metal. The conductive layer with the metal may include a metal barrier layer 145 and a metal layer 147.

The doped semiconductor layer 143 may include a pillar part 143A that fills the recess region 141, shown in FIG. 5C, and a horizontal part 143B that extends from the pillar part 143A. The pillar part 143A may be in contact with the channel layer 123 and may be surrounded by the channel layer 123. The horizontal part 143B may extend to cover the stack structure ST and the vertical insulating layer 133. The doped semiconductor layer 143 may include at least one of an n-type impurity and a p-type impurity. In an embodiment, the doped semiconductor layer 143 may include an n-type doped silicon layer.

The metal barrier layer 145 may be formed between the doped semiconductor layer 143 and the metal layer 147.

Subsequently, a first insulating layer 149 may be formed on the metal layer 147. The first insulating layer 149 may extend to cover the metal layer 147.

Figure 5E:
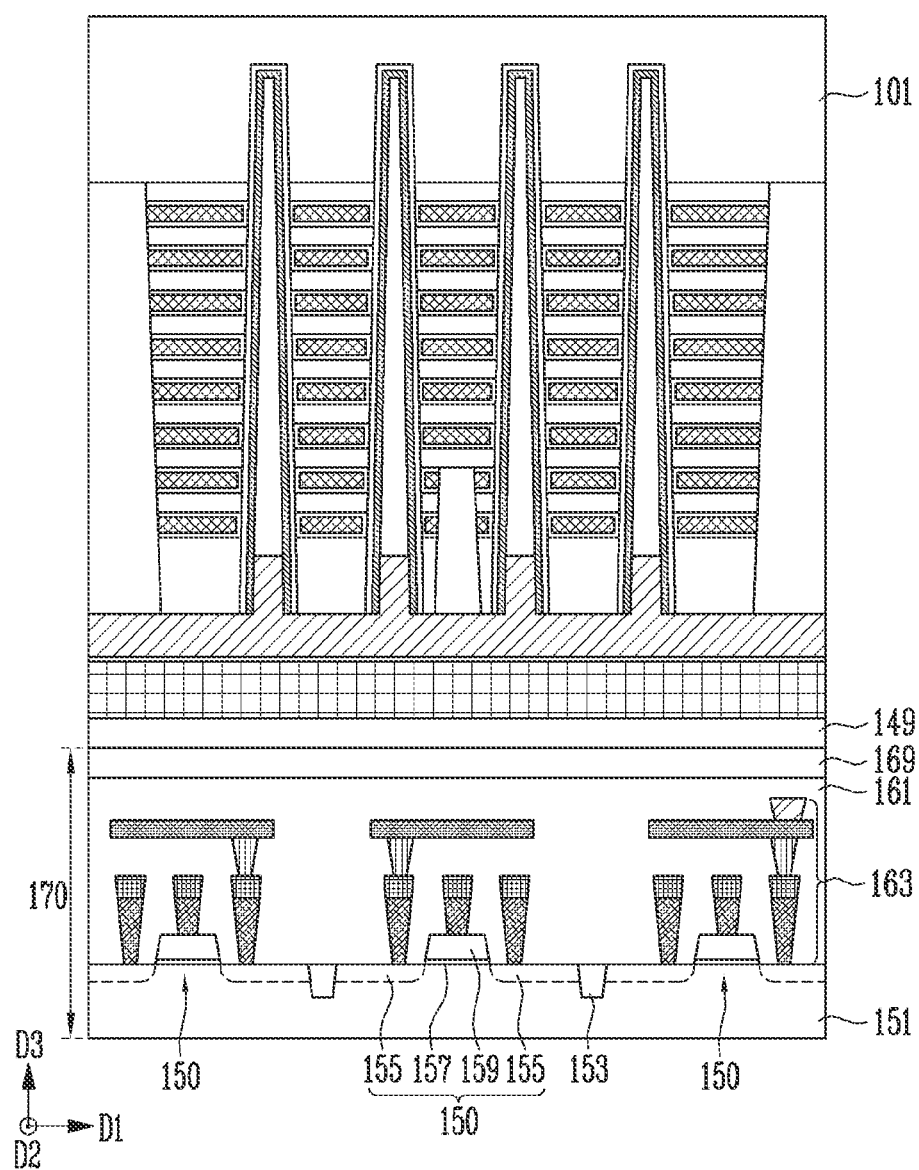

Referring to FIG. 5E, a peripheral circuit structure 170 may be disposed to face the first insulating layer 149. The peripheral circuit structure 170 may include a substrate 151 with transistors 150, an insulating structure 161 that covers the substrate 151, an interconnection structure 163, and a second insulating layer 169.

The substrate 151 may be a semiconductor substrate such as a silicon substrate or a germanium substrate. Each of the transistors 150 may be formed in an active region of the substrate 151, which is partitioned by isolation layers 153. Each of the transistors 150 may include a gate insulating layer 157 that is disposed on the active region, a gate electrode 159 that is disposed on the gate insulating layer 157, and junctions 155 that are formed in the active region at both sides of the gate electrode 159. The transistors 150 may constitute a peripheral circuit that controls an operation of memory cell strings.

The insulating structure 161 may include two or more insulating layers. The interconnection structure 163 may be buried in the insulating structure 161 and may be connected to the transistors 150. The second insulating layer 169 may be disposed on the insulating structure 161.

The peripheral circuit structure 170 may be bonded to the first insulating layer 149. In an embodiment, the second insulating layer 169 of the peripheral circuit structure 170 may be bonded to the first insulating layer 149.

Figure 5F:
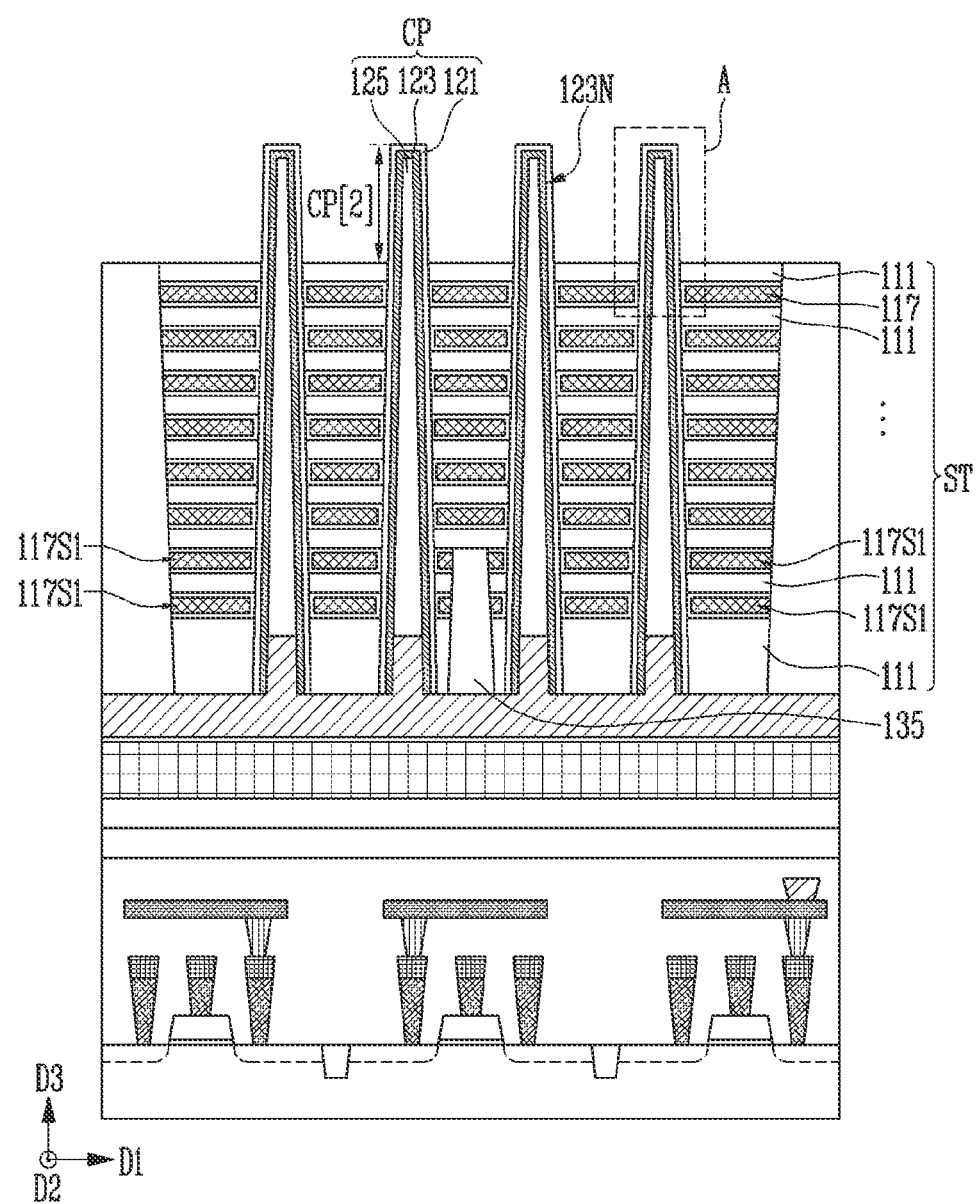

Referring to FIG. 5F, the support structure 101, shown in FIG. 5E, may be removed. Accordingly, the second part CP[2] of the cell pillar CP may be exposed. When the support structure 101 that is formed as a silicon substrate is removed, the memory layer 121 of the cell pillar CP may serve as an etch stop layer.

The support structure 101 may be removed so that the uneven structure that is described with reference to the process ST5, shown in FIG. 4, is defined by the second part CP[2] of the cell pillar CP. The second part CP[2] of the cell pillar CP may protrude farther in the third direction D3 than the stack structure ST, and therefore, the uneven structure may be defined.

Subsequently, at least one of n-type and p-type impurities may be injected into a partial region of the channel layer 123 that constitutes the second part CP[2] of each of the cell pillars CP. In an embodiment, an impurity injection region 123N may be formed in a partial region of the channel layer 123 of each of the cell pillars CP by injecting an n-type impurity into the channel layer 123.

Figure 5G:
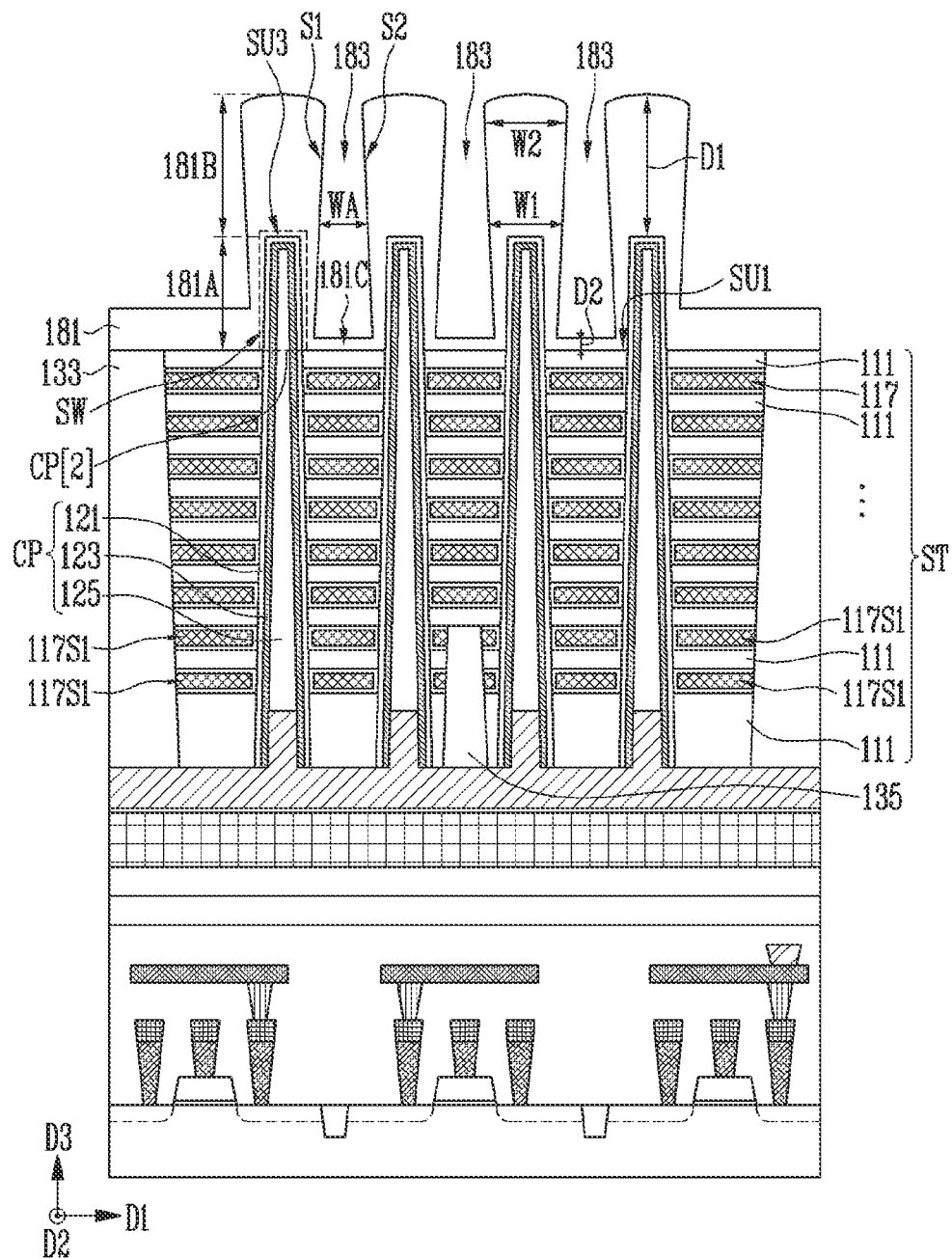

Referring to FIG. 5G, a protective layer 181 may be formed. The protective layer 181 may cover the second part CP[2] of each of the cell pillars CP. The protective layer 181 may include a material with an etch selectivity with respect to the interlayer insulating layers 111 and the conductive layers 117. In an embodiment, the protective layer 181 may include an amorphous carbon layer.

Because the protective layer 181 is formed under a condition in which step coverage is poor as described with reference to the process ST5, shown in FIG. 4, the protective layer 181 may have an overhang structure. The deposition thickness of the protective layer 181 may be controlled such that a space between the cell pillars CP might not be completely filled by the protective layer 181. The protective layer 181 may be deposited such that a first opening 183 is defined in the space between the cell pillars CP by the protective layer 181. The first opening 183 may be defined between a first inclined surface S1 and a second inclined surface S2 of the protective layer 181, which face each other between cell pillars CP. The width WA of the first opening 183 may narrow as the first opening 183 moves farther from the stack structure, due to the protective layer 181 with the overhang structure.

The protective layer 181 may include a shielding pattern 181A, a protrusion pattern 181B, and a horizontal pattern 181C. The protrusion pattern 181B and the horizontal pattern 181C may extend from the shielding pattern 181A.

The shielding pattern 181A may be a portion of the protective layer 181 that surrounds a sidewall SW of the second part CP[2] of the cell pillar CP. The second part CP[2] of the cell pillar CP may include a surface SU3 that faces the third direction D3. The protrusion pattern 181B may be a portion of the protective layer 181 disposed on the surface SU3 of the second part CP[2]. The width of the protrusion pattern 181B may widen as the protrusion pattern 181B moves farther from the second part CP[2]. Specifically, the first width W1 of the protrusion pattern 181B that is adjacent to the second part CP[2] may be formed to be narrower than the second width W2 at an upper end of the protrusion pattern 181B. Based on the structure of the protrusion pattern 181B as described above, the overhang structure may be defined.

The horizontal pattern 181C may be a portion of the protective layer 181 that overlaps with the stack structure ST between the first inclined surface S1 and the second inclined surface S2. Because the protective layer 181 is deposited under the condition in which the step coverage is poor, a thickness D1 of the protrusion pattern 181 that is deposited on the surface SU3 of the second part CP[2] may be thicker than that D2 of the horizontal pattern 181C that is deposited on the first surface SU1 of the stack structure ST.

Figure 5H:
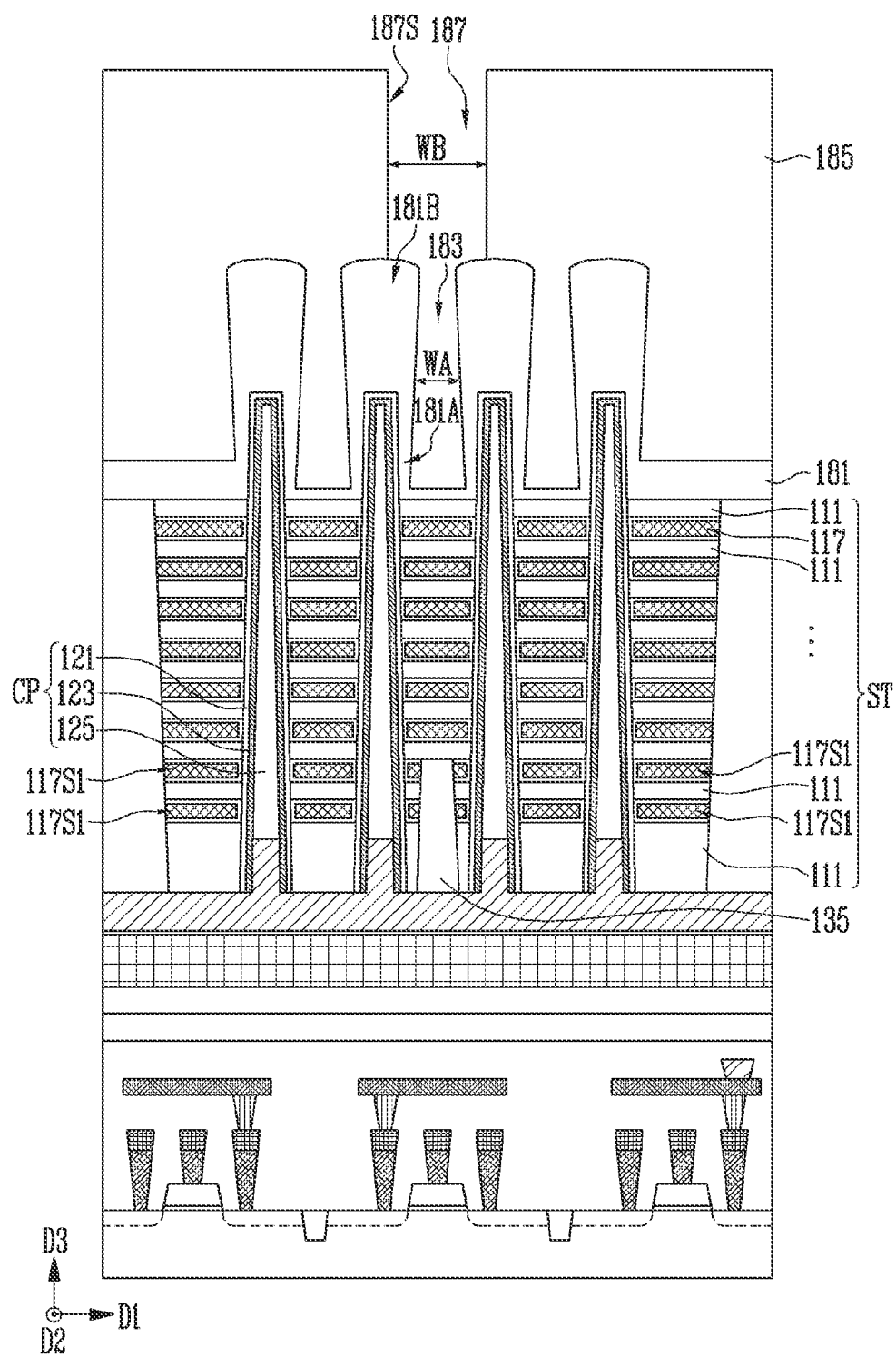

Referring to FIG. 5H, a mask pattern 185 may be formed on the protective layer 181 by using a photolithography process. The mask pattern 185 may be a photoresist pattern. The mask pattern 185 may include a second opening 187.

The second opening 187 may extend in the second direction D2. The second opening 187 may overlap with the first opening 183. In an embodiment, the second opening 187 may expose the first opening 183, which overlaps with the isolation layer 135. However, the embodiment of the present disclosure is not limited thereto, and the position and shape of the second opening 187 may vary.

The width WB of the second opening 187 may be formed to be wider than the width WA of the first opening 183. In an embodiment, a sidewall 187S of the second opening 187 may overlap with the protrusion pattern 181B.

In accordance with an embodiment of the present disclosure, the conductive layer 117 around the cell pillars CP may be blocked by the shielding pattern 181A and the protrusion pattern 181B of the protective layer 181. Accordingly, although the width WB of the second opening 187 is formed to be wider than the width WA of the first opening 183, a partial region of the conductive layer 117 around the cell pillars CP may be protected from a subsequent etching process through the protective layer 181.

In accordance with the embodiment of the present disclosure, because it is unnecessary to control the width WB of the second opening 187 to be smaller than or equal to the width WA of the first opening 183, the mask pattern 185 may be formed even when a high-resolution exposure apparatus is not used.

Figure 5I:
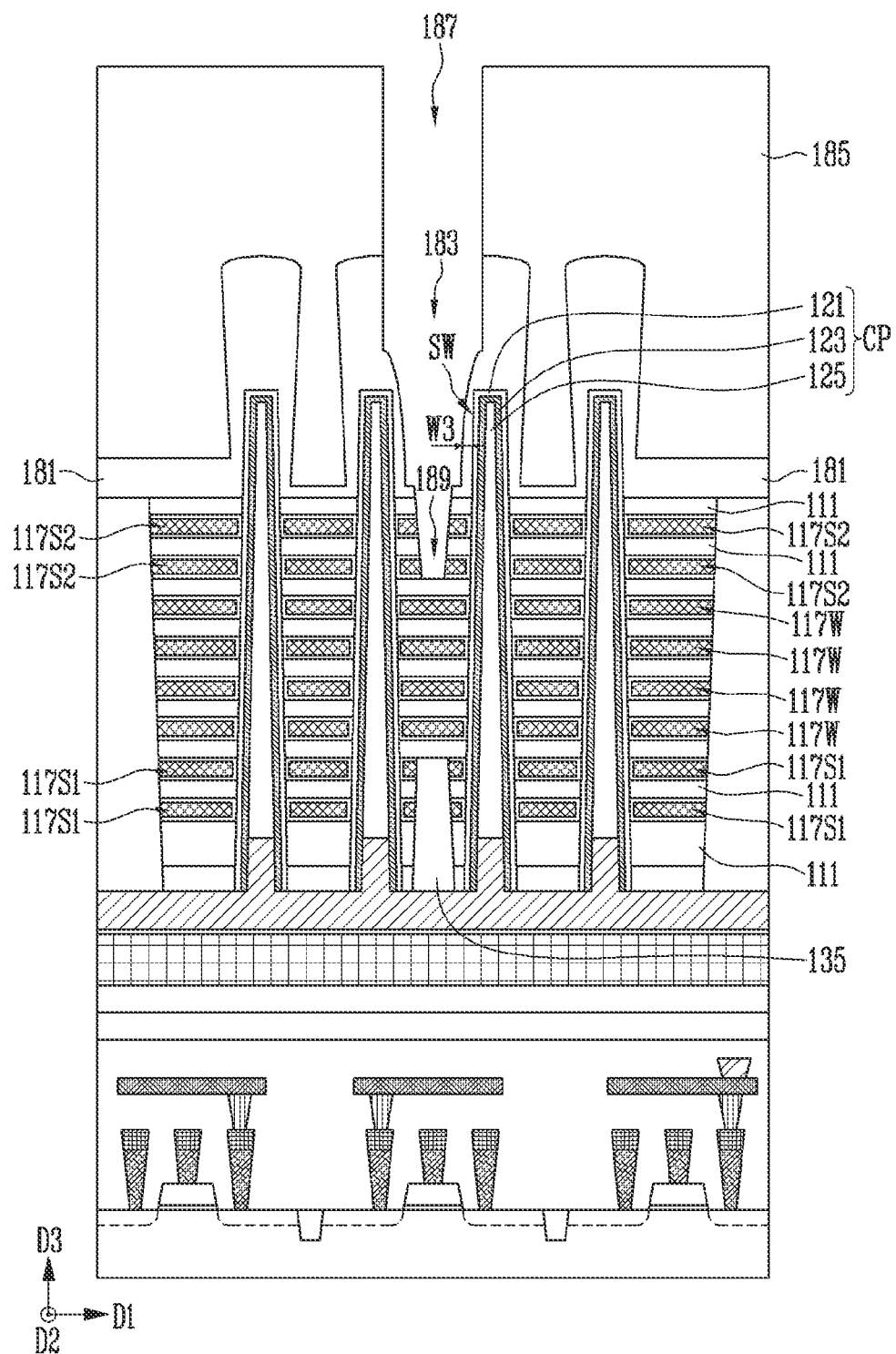

Referring to FIG. 5I, a slit 189 may be formed by etching a portion of the stack structure ST through the second opening 187 and the first opening 183. The slit 189 may extend in the second direction D2.

At least one conductive layer among the conductive layers 117 of the stack structure ST that is adjacent to the first opening 183, shown in FIG. 5H, may be isolated into second select lines 117S2 by the slit 189. In an embodiment, the second select lines 117S2 may constitute drain select lines. Conductive layers between the isolation layer 135 and the slit 189 may constitute word line 117W. The word lines 117W may extend to overlap with the isolation layer 135 and the slit 189.

A portion of the protective layer 181 may be etched during an etching process for forming the slit 189. The protective layer 181 with the overhang structure, having different thicknesses and different widths with respect to regions as described with reference to FIG. 5G, may remain with a width W3 decreased between the sidewall SW of the cell pillar CP and the first opening 183. More specifically, a partial region of the protective layer 181 that is exposed by the second opening 187 might not be completely removed, but may remain with a decreased width W3. A partial region of the protective layer 181 that remains between the sidewall SW of the cell pillar CP and the first opening 183 may protect the conductive layer 117 from the etching process. Accordingly, the second select line 117S2 may remain between the slit 189 and the sidewall SW of the cell pillar CP, and thus, a select transistor with a gate all around (GAA) structure may be defined as described with reference to FIG. 3A.

Figure 5J:
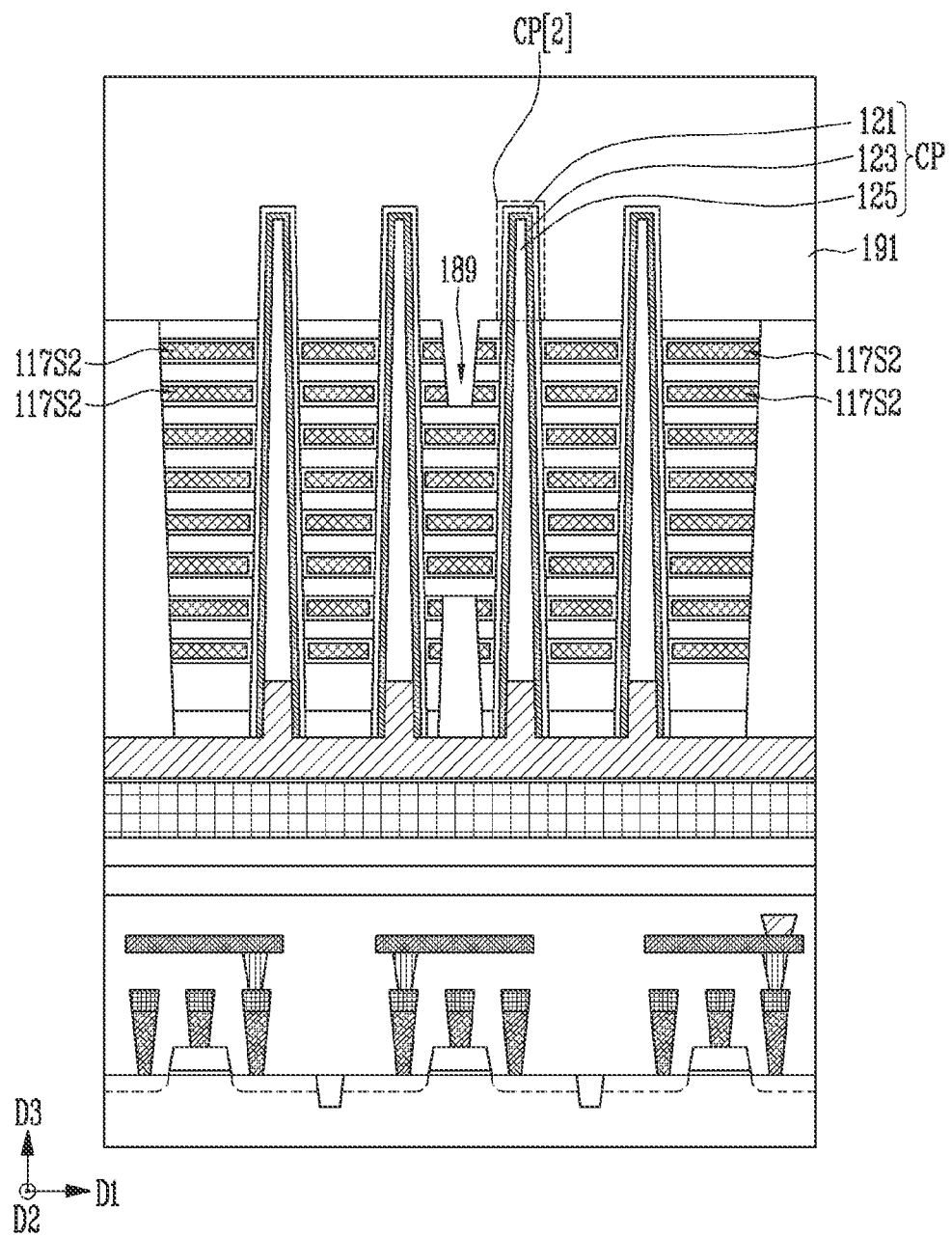

Referring to FIG. 5J, the protective layer 181 and the mask pattern 185, which are shown in FIG. 5I, may be removed such that cell pillars CP may be exposed. Subsequently, an upper insulating layer 191 may be formed. The upper insulating layer 191 may extend to fill the slit 189 between the second select lines 117S2 and to cover the second part CP[2] of each of the cell pillars CP. The surface of the upper insulating layer 191 may be planarized through a process, such as Chemical Mechanical Polishing (CMP).

Figure 5K:
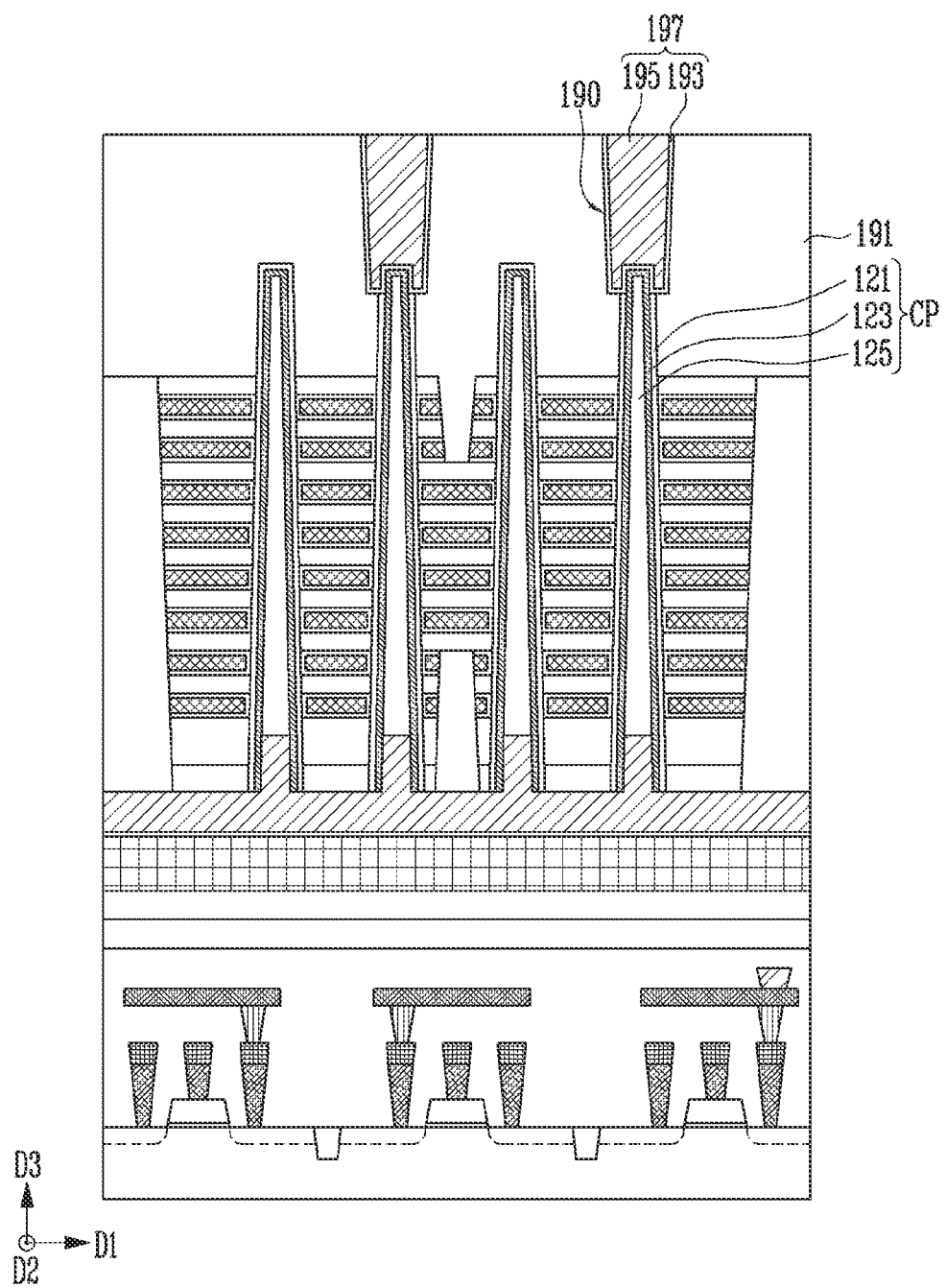

Referring to FIG. 5K, a bit line contact 197 may be formed, which is in contact with the channel layer 123 of the cell pillar CP. The process of forming the bit line contact 197 may include a process of forming a contact hole 190 that penetrates the upper insulating layer 191 and the memory layer 121 and a process of filling the contact hole 190 with a conductive material.

The conductive material that constitutes the bit line contact 197 may vary. In an embodiment, the bit line contact 197 may include a metal barrier layer 193 and a metal layer 195. The metal barrier layer 193 may extend along a surface of the contact hole 190 and may be in contact with the channel layer 123. The metal layer 195 may be disposed on the metal barrier layer 193.

Figure 5L:
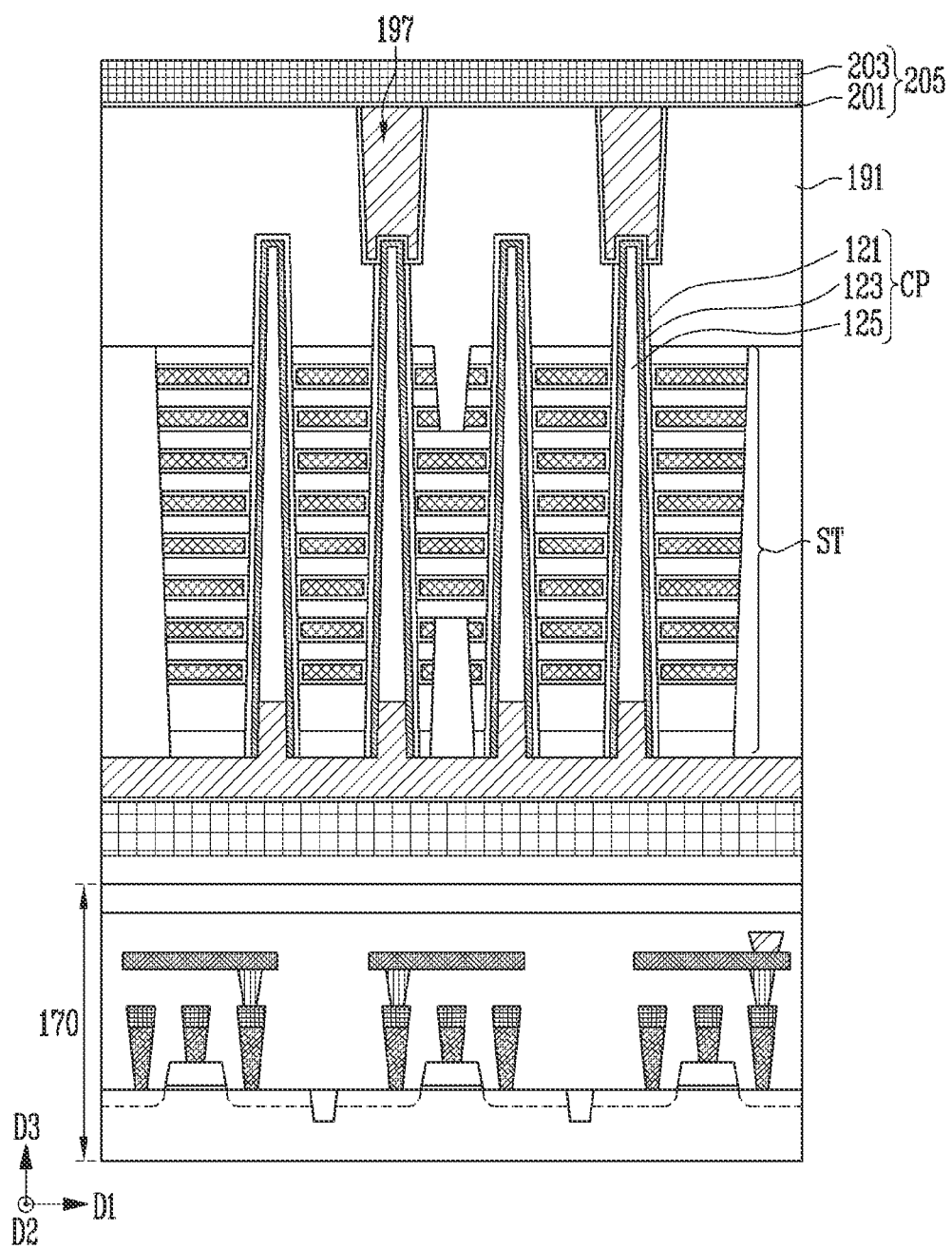

Referring to FIG. 5L, a bit line 205 that is in contact with the bit line contact 197 may be formed on the upper insulating layer 191. The bit line 205 may overlap with the peripheral circuit structure 170, the stack structure ST being interposed therebetween. The conductive material of the bit line 205 may vary. In an embodiment, the bit line 205 may include a metal barrier layer 201 and a metal layer 203. The metal barrier layer 201 may extend to be in contact with the bit line contact 197 and to overlap with the upper insulating layer 191. The metal layer 203 may be disposed on the metal barrier layer 201.

The cell pillars CP, shown in FIGS. 5K and 5L, may include cell pillars that are connected to the bit line 205, shown in the drawings, and cell pillars that are connected to another bit line, which is not shown in the drawings. Some of the cell pillars CP, which are not connected to the bit line 205, may be connected to another bit line, which is not shown in the drawings via bit line contacts, which are not shown in the drawings.

Figure 6B:
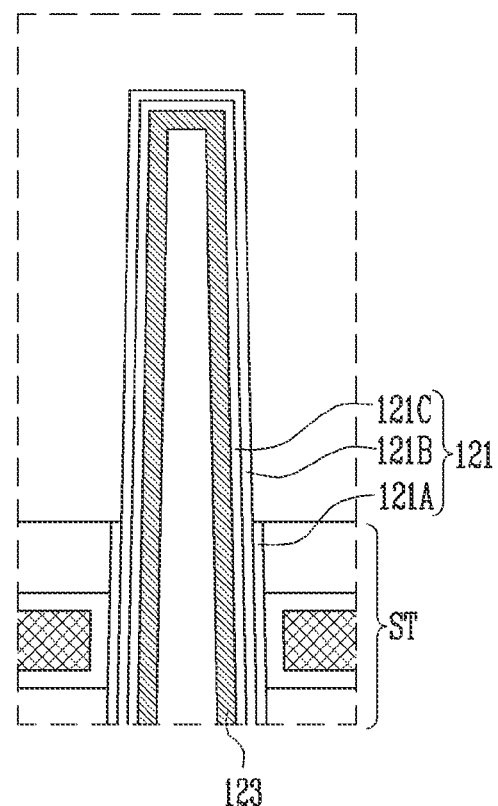
Figure 6C:
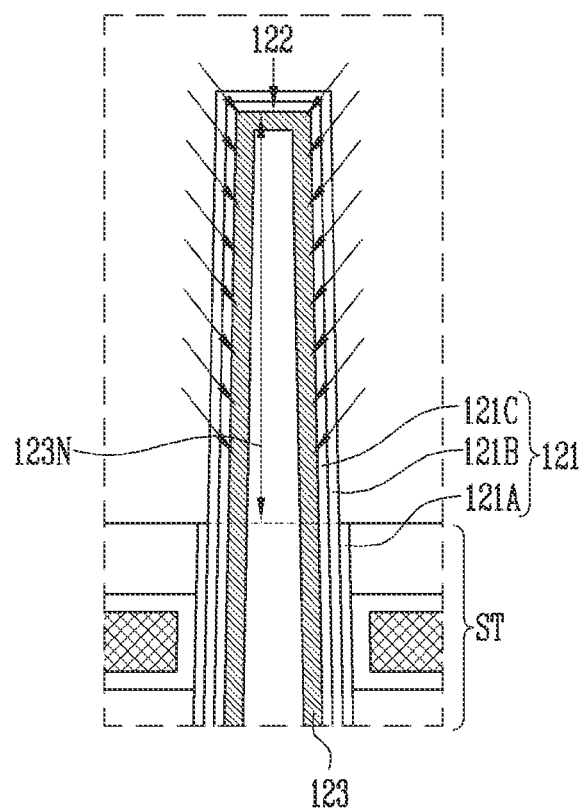

FIGS. 6A to 6C are sectional views illustrating an embodiment of the process of forming the impurity injection region shown in FIG. 5F. FIGS. 6A to 6C are enlarged sectional views of region A shown in FIG. 5F.

Referring to FIG. 6A, when the support structure 101, shown in FIG. 5E, is removed, the blocking insulating layer 121A of the memory layer 121 may be exposed. The blocking insulating layer 121A, the data storage layer 121B, and the tunnel insulating layer 121C of the memory layer 121 may be made of the same materials as the blocking insulating layer 63, the data storage layer 65, and the tunnel insulating layer 67, which are described with reference to FIG. 3A.

A partial region of the blocking insulating layer 121A that is surrounded by the stack structure ST might not be exposed, but may be protected by the stack structure ST.

Referring to FIG. 6B, the exposed region of the blocking insulating layer 121A may be selectively removed. In an embodiment, the exposed region of the blocking insulating layer 121A may be removed through wet etching. Accordingly, a partial region of the data storage layer 121B may be exposed.

Referring to FIG. 6C, at least one of n-type and p-type impurities may be injected into a partial region of the channel layer 123, which is not surrounded by the blocking insulating layer 121A and the stack structure ST. Accordingly, the impurity injection region 123N may be formed in the partial region of the channel layer 123. In an embodiment, the impurity injection region 123N may be formed by injecting an n-type impurity 122 into the partial region of the channel layer 123.

FIGS. 7A to 7H are sectional views illustrating a manufacturing method of a semiconductor memory device in accordance with an embodiment of the present disclosure.

Figure 7A:
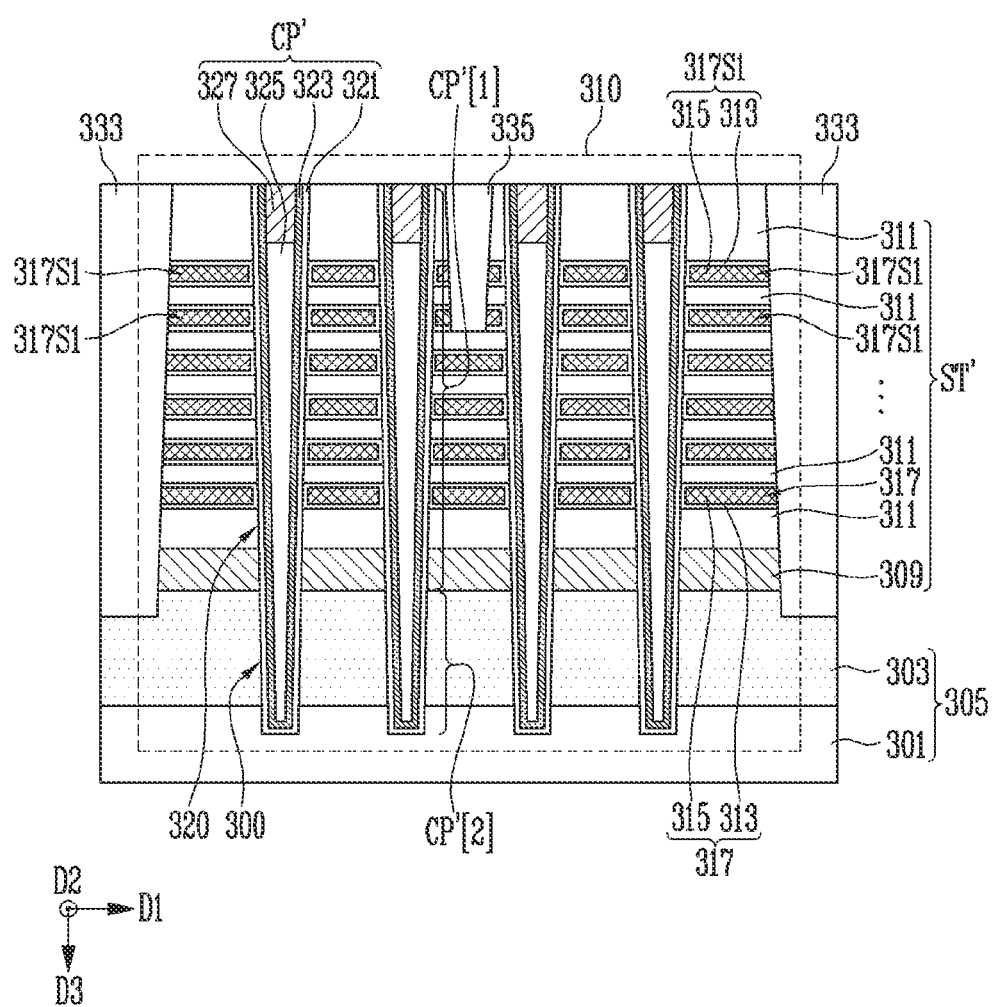
FIGS. 7A to 7H are sectional views illustrating a manufacturing method of a semiconductor memory device in accordance with an embodiment of the present disclosure.

Referring to FIG. 7A, a preliminary memory cell array 310 that is formed through the process ST1, shown in FIG. 4, may be supported by a support structure 305. The preliminary memory cell array 310 may include a stack structure ST' and cell pillars CP'.

The support structure 305 may include a silicon substrate 301 that overlaps with the stack structure ST' and an etch stop layer 303 that is disposed between the stack structure ST' and the silicon substrate 301. The etch stop layer 303 may include a material with an etch selectivity with respect to the silicon substrate 301. In an embodiment, the etch stop layer 303 may include a nitride layer.

The stack structure ST' may be disposed between vertical insulating layers 333. The stack structure ST' may include conductive layers 309, 317, and 317S1 and interlayer insulating layers 311, which are alternately stacked on the support structure 305. The conductive layers 309, 317, and 317S1 and the interlayer insulating layers 311 may extend in the first direction D1 and the second direction D2. The conductive layers 309, 317, and 317S1 and the interlayer insulating layers 311 may be disposed at levels that are spaced apart from the support structure 305 at different distances.

Each of the conductive layers 309, 317, and 317S1 may include various conductive materials, such as a metal layer, a metal silicide layer, and a doped silicon layer. In an embodiment, the conductive layers 309, 317, and 317S1 may include a first conductive layer 309 that is adjacent to the support structure 305 and second conductive layers 317 and 317S1 that are stacked on the first conductive layer 309 to be spaced apart from each other. In an embodiment, the first conductive layer 309 may include doped silicon. Each of the second conductive layers 317 and 317S1 may include a metal barrier layer 313 and a metal layer 315, similarly to the conductive layer 117, shown in FIG. 5A.

Each of the cell pillars CP' may include a first part CP'[1] that penetrates the stack structure ST' and a second part CP'[2] that extends in the third direction D3 toward the support structure 305 from the first part CP'[1]. The second part CP'[2] may be inserted into a groove 300 that is formed in the etch stop layer 303.

Each of the cell pillars CP' may include a memory layer 321, a channel layer 323, a core insulating layer 325, and a doped semiconductor pattern 327. The first part CP'[1] of the cell pillar CP' may include a central region that is filled with the core insulating layer 325 and the doped semiconductor pattern 327. The core insulating layer 325 may extend to a central region of the second part CP'[2]. The doped semiconductor pattern 327 may overlap with the core insulating layer 325. The doped semiconductor pattern 327 may include at least one of n-type and p-type impurities. In an embodiment, the doped semiconductor pattern 327 may include an n-type doped silicon layer.

The channel layer 323 may extend to surround a sidewall of the core insulating layer 325 and to surround a sidewall of the doped semiconductor pattern 327. The channel layer 323 may extend along a bottom surface of the core insulating layer 325, which faces the third direction D3. The memory layer 321 may extend along an outer wall of the channel layer 323, which faces the support structure 305 and the stack structure ST'.

The channel layer 323 may include a semiconductor layer. The memory layer 321 may include the blocking insulating layer 53, the data storage layer 65, and the tunnel insulating layer 67, which are shown in FIG. 3A.

The preliminary memory cell array 310 may be formed through various processes. The preliminary memory cell array 310 may be formed by using the embodiment, described with reference to FIG. 5A.

Subsequently, at least one of the conductive layers 317 and 317S1 may constitute first select lines 317S1 that are spaced apart from each other by an isolation layer 335 as described with reference to FIG. 5B. The first select lines 317S1 may constitute drain select lines or source select lines. Hereinafter, based on an embodiment in which the first select lines 317S1 constitute drain select lines, subsequent processes will be described with reference to FIGS. 7B to 7H. However, the present disclosure is not limited thereto.

Figure 7B:
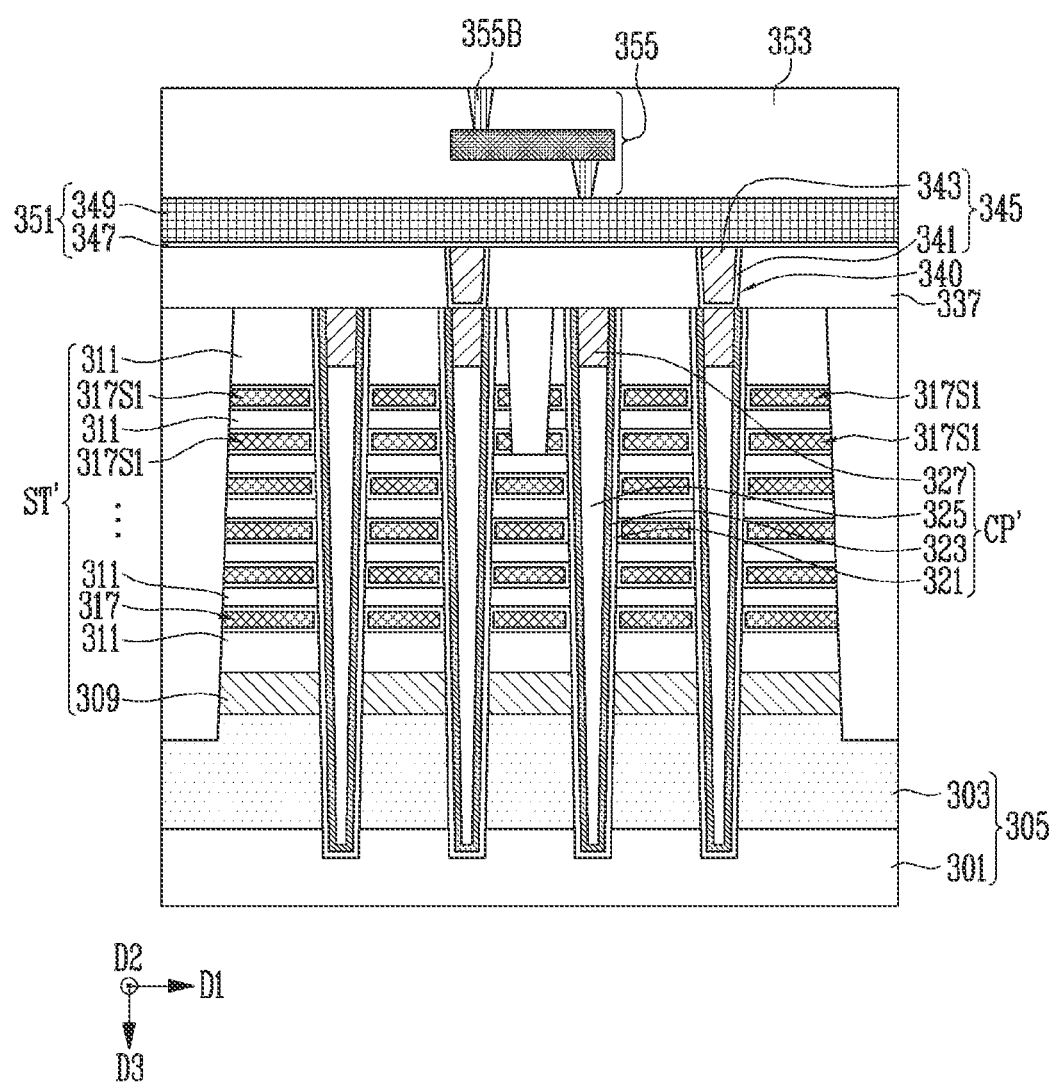

Referring to FIG. 7B, a bit line contact 345 may be formed, which is connected to the channel layer 323 of the cell pillar CP'.

In an embodiment, the process of forming the bit line contact 345 may include a process of forming a first insulating layer 337 that extends to cover the cell pillar CP' and the cell structure ST', a process of forming a contact hole 340 that penetrates the first insulating layer 337 and opens the doped semiconductor pattern 327, and a process of filling the contact hole 340 with a conductive material.

In an embodiment, the conductive material that constitutes the bit line contact 345 may include a metal barrier layer 341 and a metal layer 343. The metal barrier layer 341 may extend along a surface of the contact hole 340 and may be in contact with the doped semiconductor pattern 327. The metal layer 343 may be disposed on the metal barrier layer 341.

Subsequently, a bit line 351 may be formed, which is in contact with the bit line contact 345. The bit line 351 may extend onto the first insulating layer 337. The conductive material of the bit line 351 may vary. In an embodiment, the bit line 351 may include a metal barrier layer 347 and a metal layer 349. The metal barrier layer 347 may be in contact with the bit line contact 345 and may extend to overlap with the first insulating layer 337. The metal layer 349 may be disposed on the metal barrier layer 347.

The cell pillars CP', shown in FIG. 7B, may include cell pillars that are connected to the bit line 351, shown in the drawing, and cell pillars that are connected to another bit line, which is not shown in the drawing. Some of the cell pillars CP', which are not connected to the bit line 351, may be connected to another bit line, which is not shown in the drawing, via bit line contacts, which are not shown in the drawing.

Subsequently, a first insulating structure 353 may be formed on the bit line 351. A first interconnection structure 355 may be buried in the first insulating structure 353. The first insulating structure 353 may include two or more insulating layers. The first interconnection structure 355 may include a conductive material of various shapes and various types. The first interconnection structure 355 may include a first bonding metal pattern 355B. The first interconnection structure 355 may overlap with the stack structure ST', the bit line 351 being interposed therebetween.

Figure 7C:
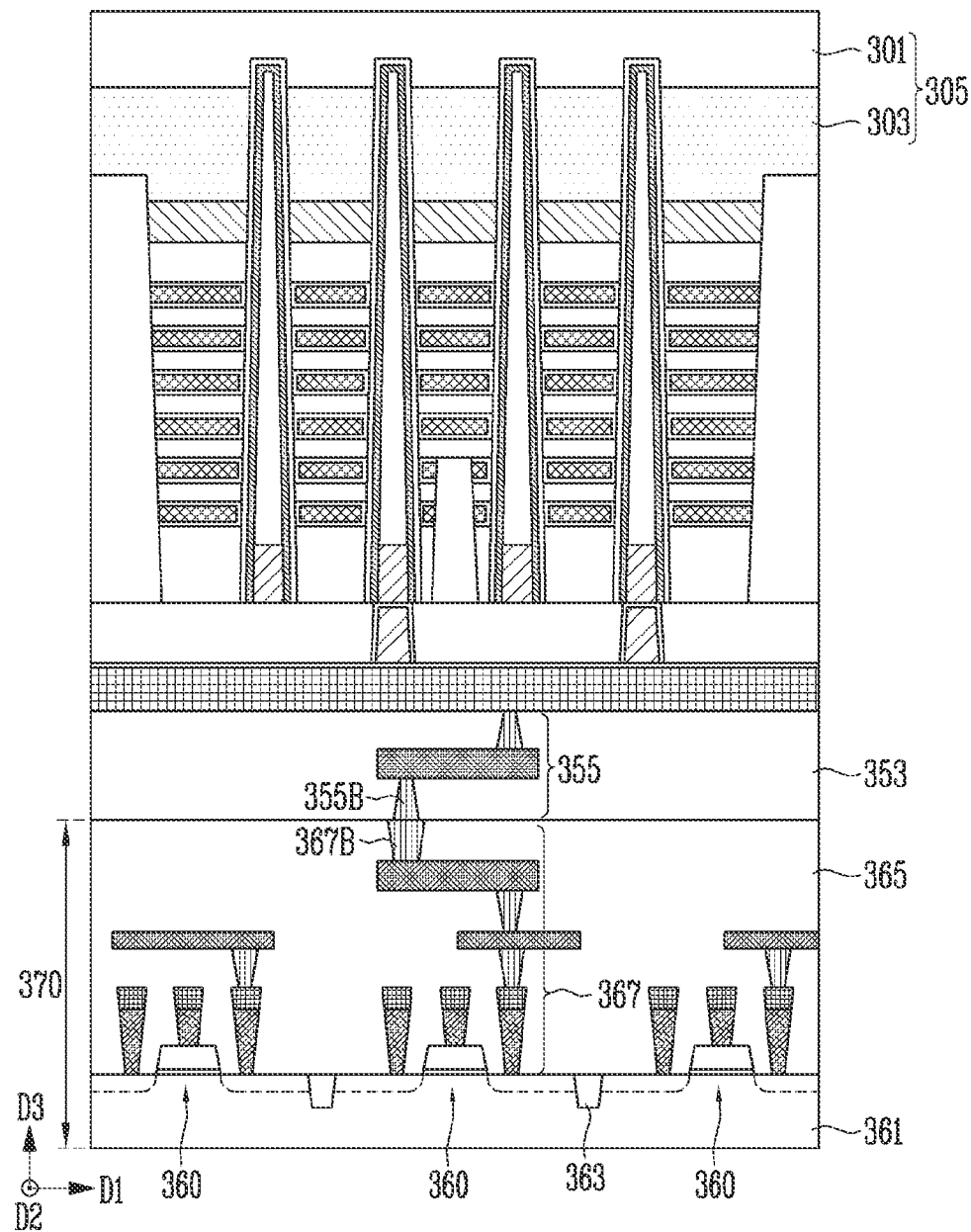

Referring to FIG. 7C, a peripheral circuit structure 370 may be disposed to face the first bonding metal pattern 355B. Similar to what has been described with reference to FIG. 5E, the peripheral circuit structure 370 may include a substrate 361 with active regions that are partitioned by isolation layers 363 and transistors 360 that are formed in the active regions, a second insulating structure 365 that covers the substrate 361, and a second interconnection structure 367.

The second interconnection structure 367 may include a conductive material of various shapes and various types. The second interconnection structure 367 may include a second bonding metal pattern 367B.

The peripheral circuit structure 370 may be bonded to the first interconnection structure 355. In an embodiment, the second insulating structure 365 of the peripheral circuit structure 370 may be bonded to the first insulating structure 353, and the second bonding metal pattern 367B of the peripheral circuit structure 370 may be bonded to the first bonding metal pattern 355B.

Figure 7D:
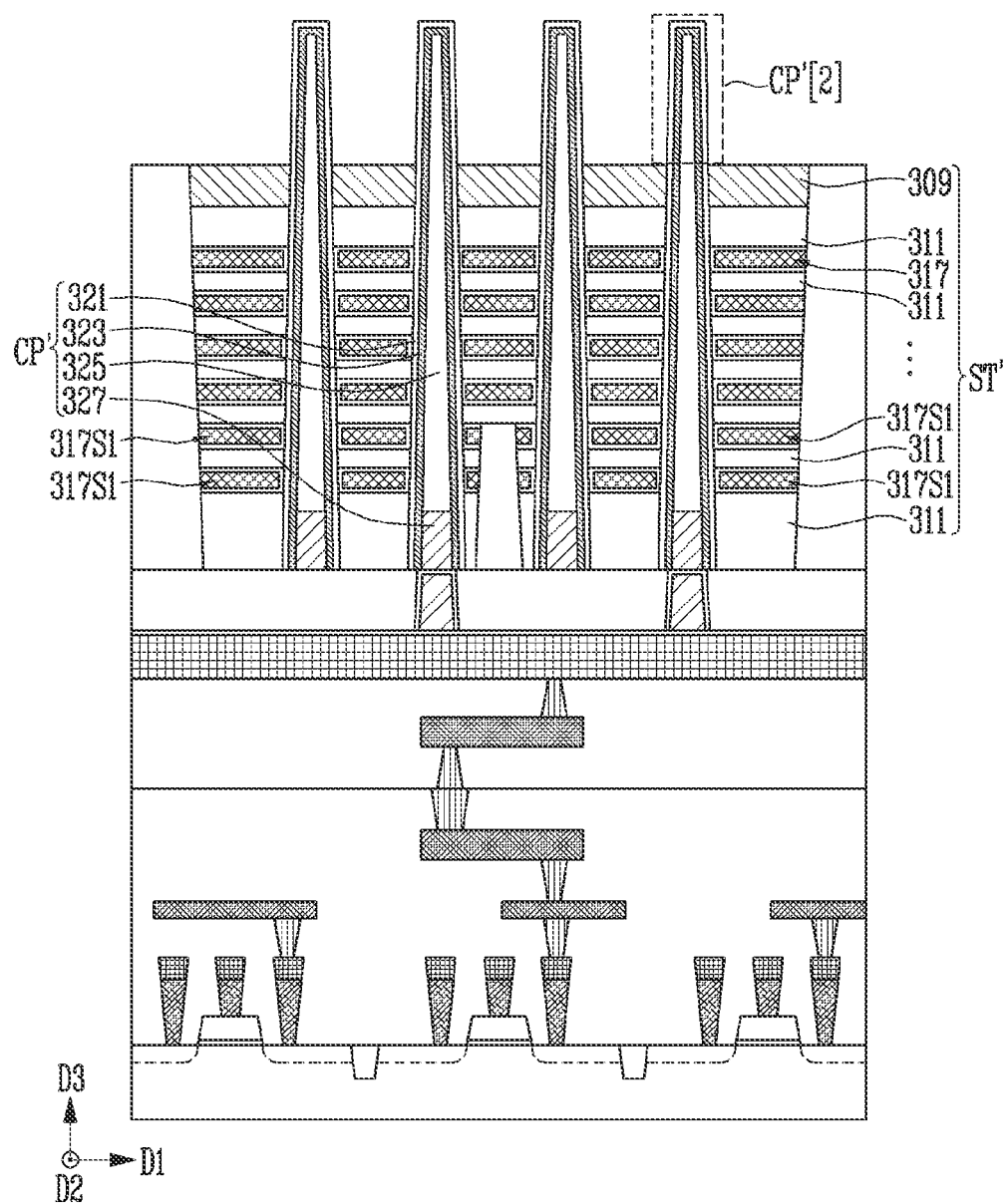

Referring to FIG. 7D, the support structure 305, shown in FIG. 7C, may be removed. While the silicon substrate 301, shown in FIG. 7C, is removed, the stack structure ST' may be protected by the etch stop layer 303, shown in FIG. 7C. While the etch stop layer 303 of the support structure 305, shown in FIG. 7C, is removed, the first conductive layer 309 may serve as an etch stop layer.

When the support structure 305 is removed, the second part CP'[2] of the cell pillar CP' may be exposed. In addition, the uneven structure that is described with reference to the process ST5, shown in FIG. 4, may be defined by the exposed second part CP'[2] of the cell pillar CP'.

Figure 7E:
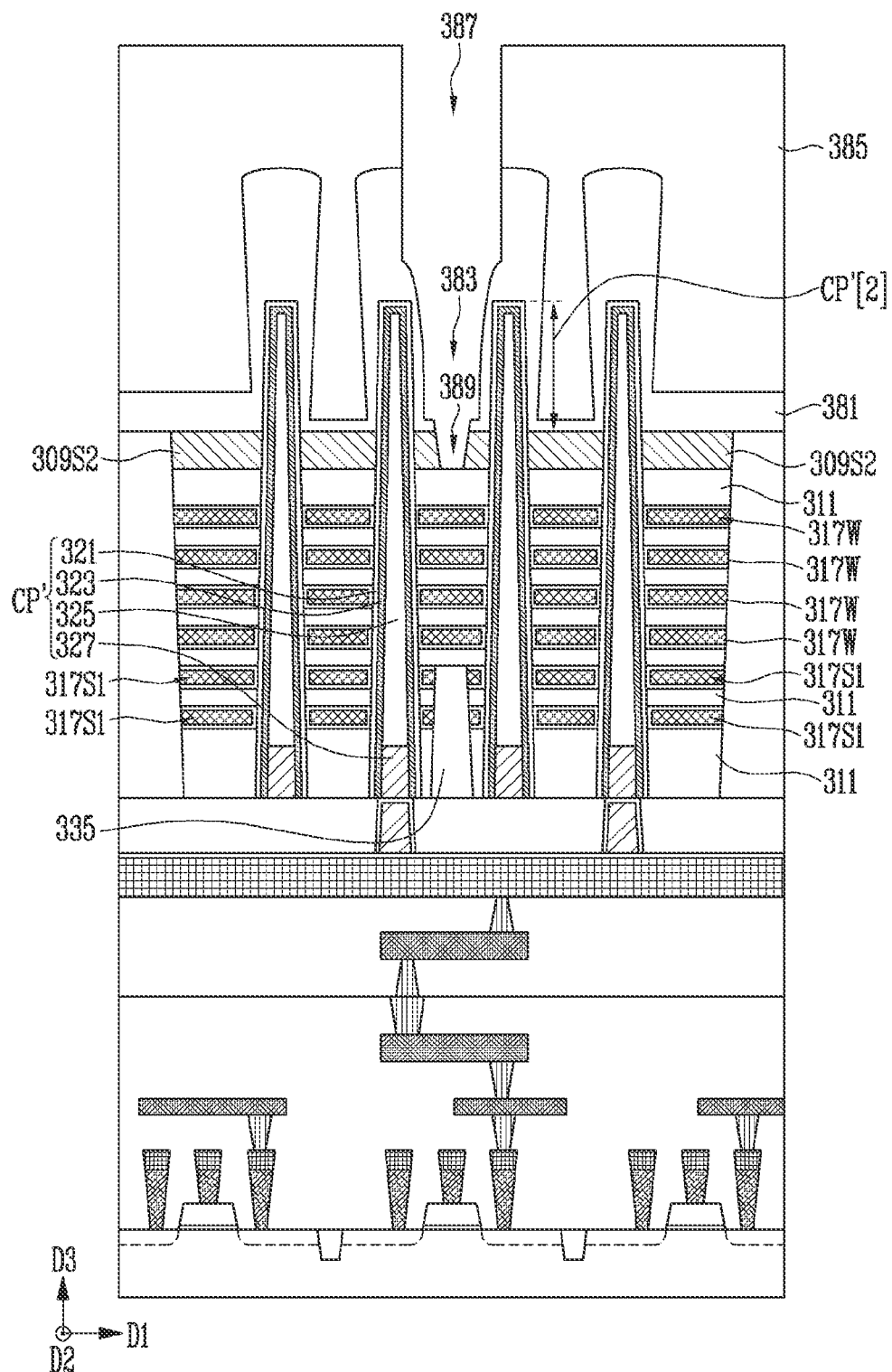

Referring to FIG. 7E, a protective layer 381 may be formed. The protective layer 381 may have an overhang structure, which covers the second part CP'[2] of each of the cell pillars CP' and defines a first opening 383, similar to what has been described with reference to FIG. 5G.

Subsequently, similar to what has been described with reference to FIG. 5H, a mask pattern 385 with a second opening 387 may be formed.

Subsequently, similar to what has been described with reference to FIG. 5I, a slit 389 may be formed by etching a portion of the stack structure ST', shown in FIG. 7D, through the second opening 387 and the first opening 383.

The slit 389 may be formed to penetrate the first conductive layer 309, shown in FIG. 7D. The first conductive layer 309, shown in FIG. 7D, may be isolated into second select lines 309S2 by the slit 389. In an embodiment, the second select lines 309S2 may constitute source select lines. Conductive layers between the second select line 309S2 and the first select line 317S1 may constitute word lines 317W. The word lines 317W may extend to overlap with the isolation layer 335 and the slit 389.

Figure 7F:
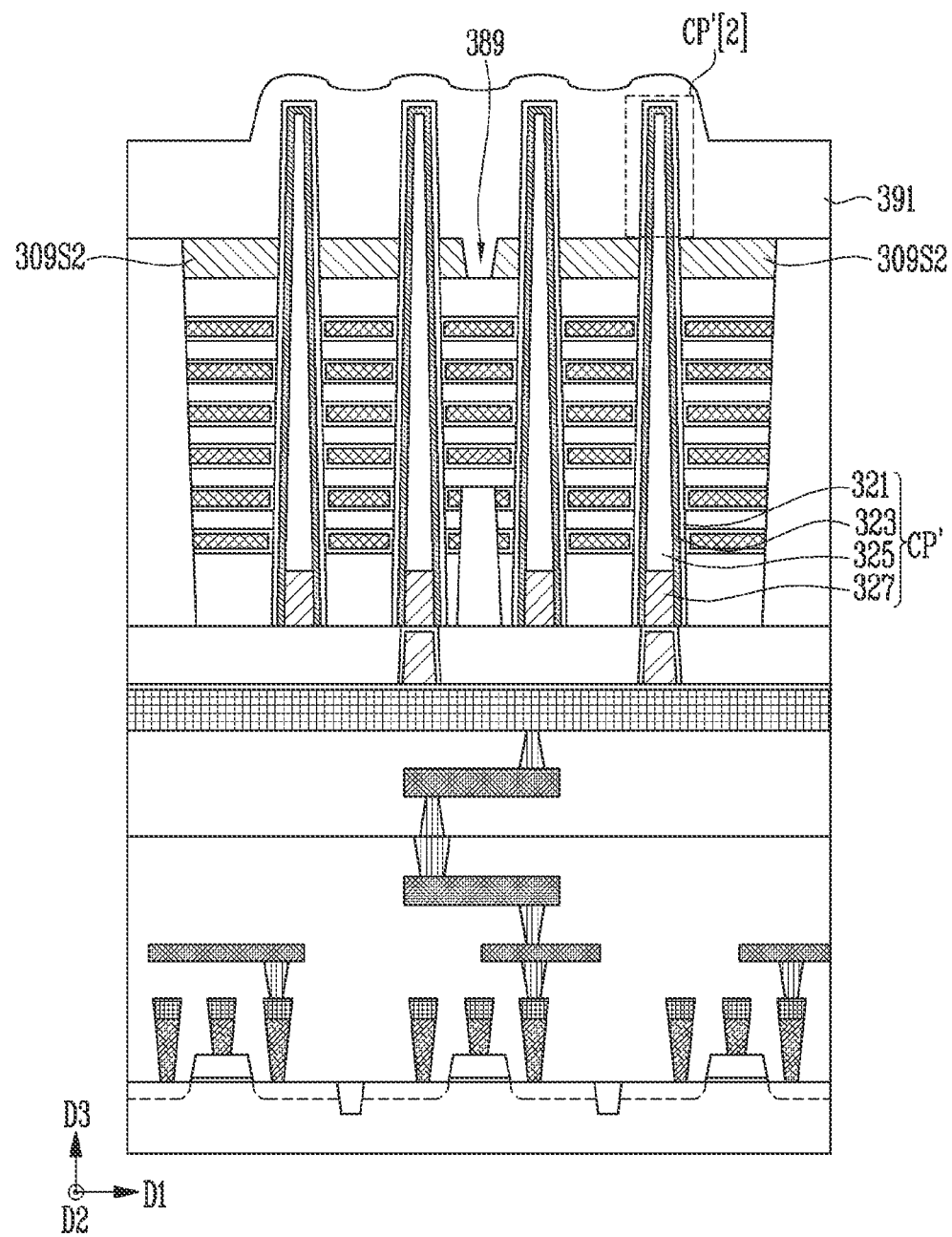

Referring to FIG. 7F, the protective layer 381 and the mask pattern 385, which are shown in FIG. 7E, may be removed such that the cell pillars CP' may be exposed. Subsequently, an upper insulating layer 391 may be formed. The upper insulating layer 391 may extend to fill the slit 389 between the second select lines 309S2 and to cover the second part CP'[2] of each of the cell pillars CP'.

Figure 7G:
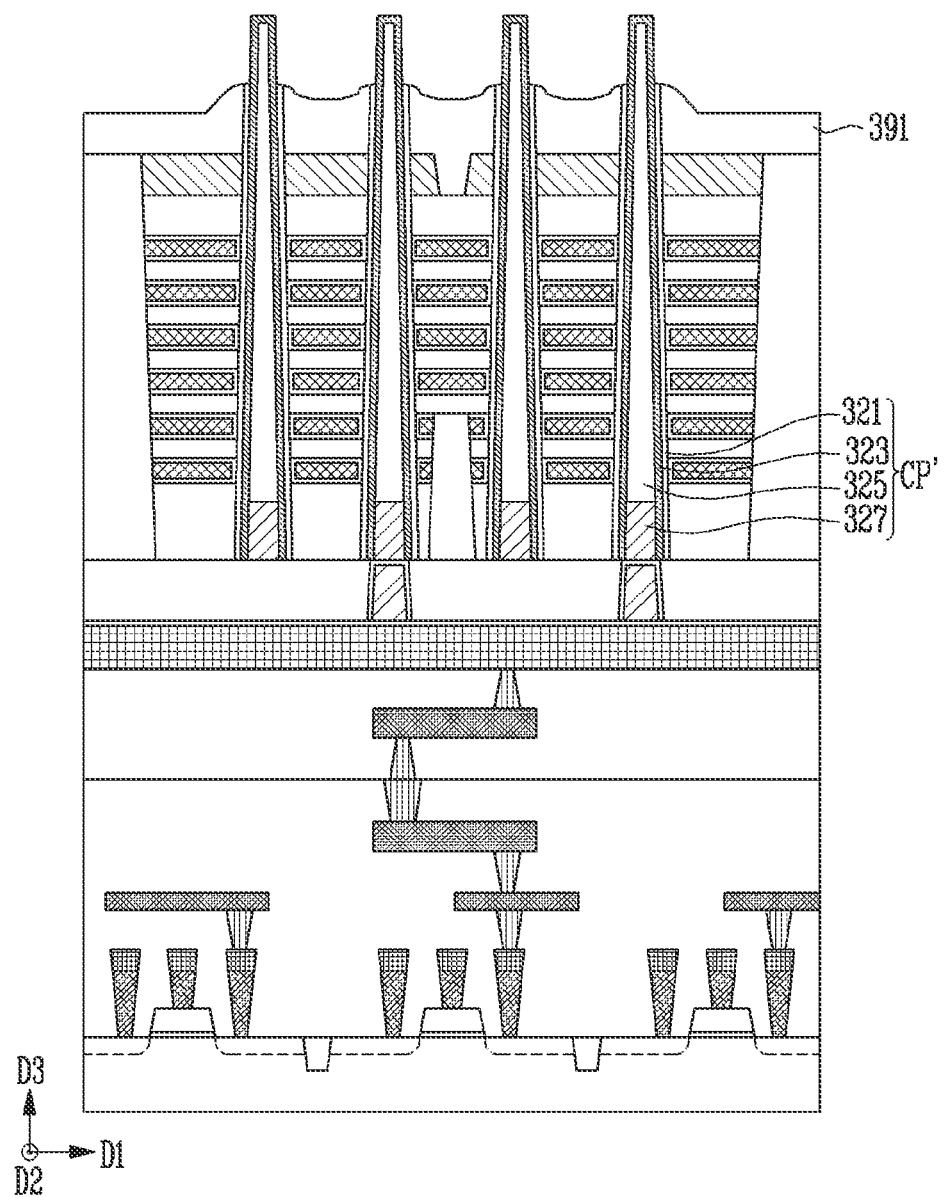

Referring to FIG. 7G, a portion of the upper insulating layer 391 and a portion of the memory layer 321 may be removed through an etching process, such as an etch-back process, such that the channel layer 323 of each of the cell pillars CP' may be exposed.

Figure 7H:
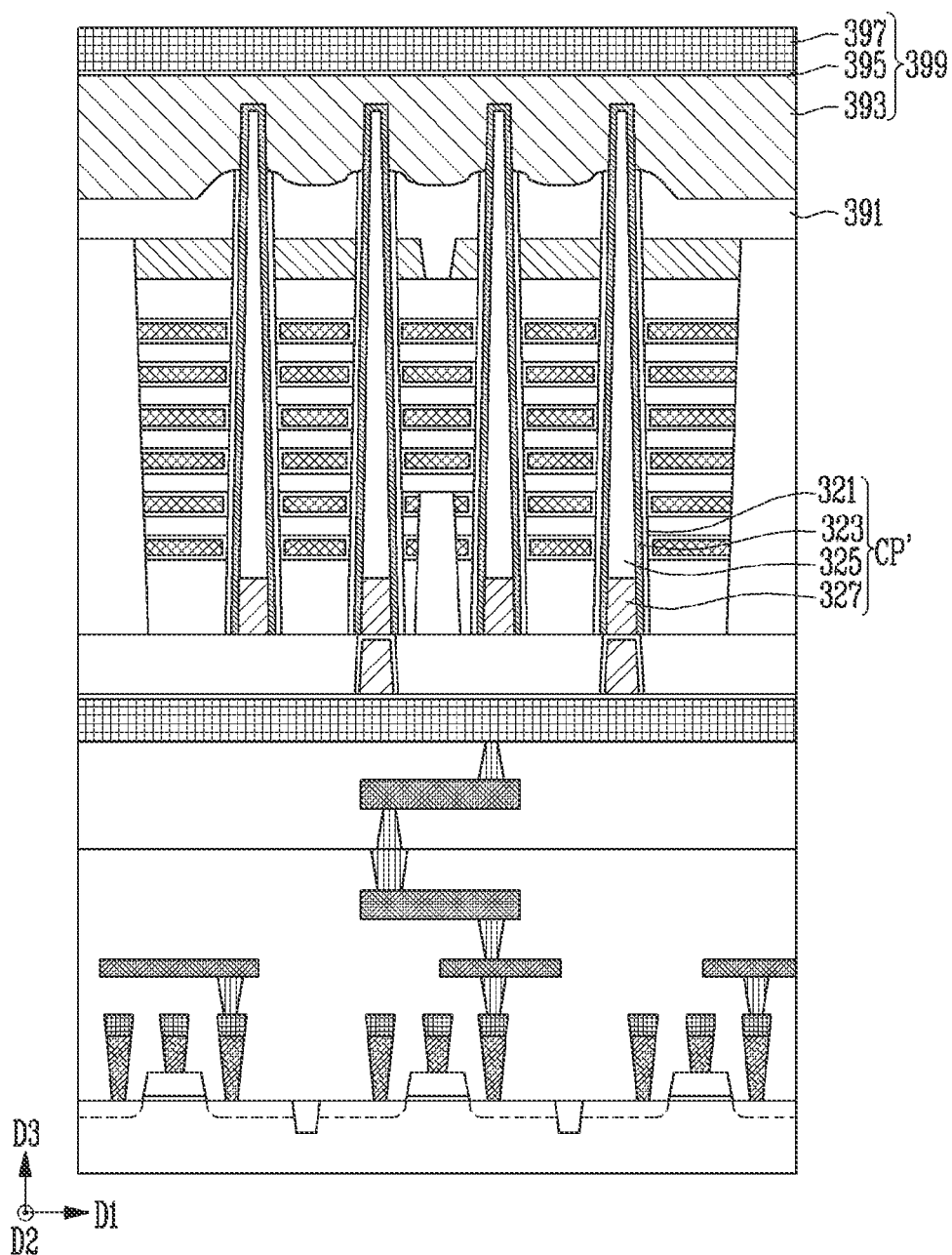

Referring to FIG. 7H, a source layer 399 may be formed. The source layer 399 may be connected to the channel layer 323 of each of the cell pillars CP'. In an embodiment, the source layer 399 may include a doped semiconductor layer 393 and a conductive layer with a metal. The conductive layer with the metal may include a metal barrier layer 395 and a metal layer 397.

The doped semiconductor layer 393 may be in contact with the channel layer 323. The doped semiconductor layer 393 may include at least one of n-type and p-type impurities. In an embodiment, the doped semiconductor layer 393 may include an n-type doped silicon layer.

The metal barrier layer 395 may be formed between the doped semiconductor layer 393 and the metal layer 309.

Figure 8:
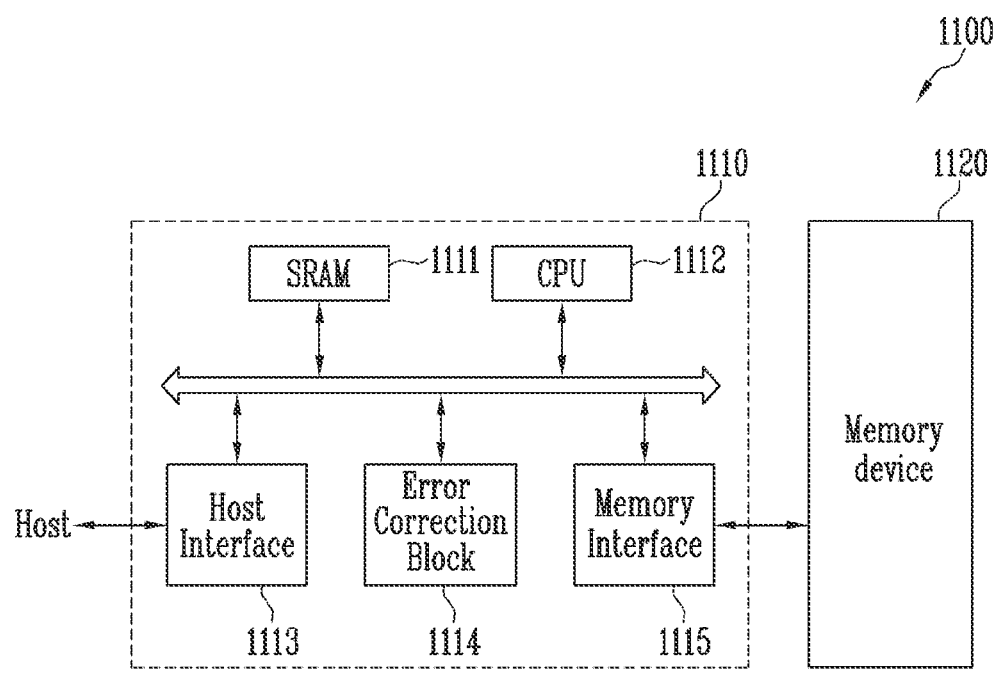
FIG. 8 is a block diagram illustrating a configuration of a memory system in accordance with an embodiment of the present disclosure.

FIG. 8 is a block diagram illustrating a configuration of a memory system 1100 in accordance with an embodiment of the present disclosure.

Referring to FIG. 8, the memory system 1100 includes a memory device 1120 and a memory controller 1110.

The memory device 1120 may include a memory cell array and a peripheral circuit structure, which are coupled to each other through bonding, and may include select transistors that are adjacent to the peripheral circuit structure. The select transistors may be connected to select lines that are isolated by a slit. Each of the select transistors may have a gate all around (GAA) structure.

The memory device 1120 may be a multi-chip package configured with a plurality of flash memory chips.

The memory controller 1110 may control the memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host that is connected with the memory system 1100. The error correction block 1114 may detect and correct an error that is included in a data that is read from the memory device 1120. The memory interface 1115 may interface with the memory device 1120. The memory controller 1110 may further include a Read Only Memory (ROM) for storing code data for interfacing with the host, and the like.

Figure 9:
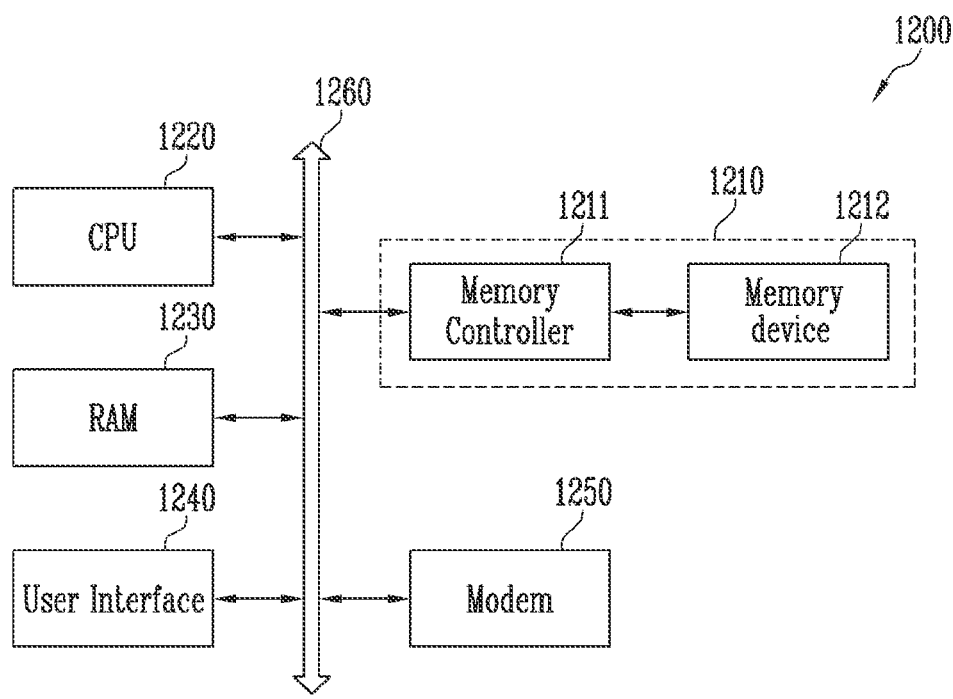
FIG. 9 is a block diagram illustrating a configuration of a computing system in accordance with an embodiment of the present disclosure.

FIG. 9 is a block diagram illustrating a configuration of a computing system 1200 in accordance with an embodiment of the present disclosure.

Referring to FIG. 9, the computing system 1200 may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may be configured with a memory device 1212 and a memory controller 1211. The memory device 1212 may include a memory cell array and a peripheral circuit structure, which are coupled to each other through bonding, and may include select transistors that are adjacent to the peripheral circuit structure. The select transistors may be connected to select lines that are isolated by a slit. Each of the select transistors may have a gate all around (GAA) structure.

In accordance with the present disclosure, a select transistor, which is defined at an intersection portion of a select line and a cell pillar, may be formed in a gate all around (GAA) structure, so that operational characteristics of the semiconductor memory device may be improved.

What is claimed is:

1. A method of manufacturing a semiconductor memory device, the method comprising:
forming a preliminary memory cell array on a support structure, the preliminary memory cell array with a stack structure and cell pillars, wherein the stack structure includes interlayer insulating layers and conductive layers that are alternately stacked on the support structure, and wherein each of the cell pillars has a first part that penetrates the stack structure and a second part that extends into the support structure from the first part;

removing the support structure to expose the second part of each of the cell pillars;

forming a protective layer that covers the second part of each of the cell pillars, wherein the protective layer has a first inclined surface and a second inclined surface that face each other, wherein a first opening is interposed between the first inclined surface and the second inclined surface, wherein the first inclined surface and the second inclined surface are disposed between the cell pillars, and wherein a width of the first opening narrows as the first opening moves farther from the second part;

forming a mask pattern that exposes the first opening on the protective layer; and etching at least one conductive layer among the conductive layers that is adjacent to the first opening, thereby isolating the at least one conductive layer into select lines.

2. The method of claim 1, wherein the protective layer includes a material with an etch selectivity with respect to the interlayer insulating layers and the conductive layers.

3. The method of claim 1, wherein the protective layer includes an amorphous carbon layer.

4. The method of claim 1, wherein the protective layer includes:
a shielding pattern surrounding a sidewall of the second part; and
a protrusion pattern disposed on a surface of the second part, the protrusion pattern extending from the shielding pattern, and
wherein a width of the protrusion pattern widens as the protrusion pattern moves farther from the second part.

5. The method of claim 4, wherein the protective layer further includes a horizontal pattern that overlaps with the stack structure between the first inclined surface and the second inclined surface, and
wherein a thickness of the protrusion pattern is thicker than a thickness of the horizontal pattern.

6. The method of claim 4, wherein the mask pattern includes a second opening overlapping with the first opening, and
wherein a sidewall of the second opening overlaps with the protrusion pattern.

7. The method of claim 1, wherein the mask pattern includes a second opening that overlaps with the first opening, and
wherein a width of the second opening is formed to be wider than the width of the first opening.

8. The method of claim 1, wherein the support structure includes a silicon substrate with a groove into which the second part is inserted.

9. The method of claim 1, wherein the support structure includes:
a silicon substrate overlapped by the stack structure; and
an etch stop layer disposed between the stack structure and the silicon substrate, the etch stop layer with a groove into which the second part is inserted.

10. The method of claim 9, wherein the etch stop layer includes a material with an etch selectivity with respect to the silicon substrate.

11. The method of claim 9, wherein the etch stop layer includes a nitride layer.

12. The method of claim 1, wherein each of the cell pillars includes:
a core insulating layer disposed in a central region of the first part, the core insulating layer extending to a central region of the second part;
a channel layer surrounding a sidewall of the core insulating layer, the channel layer extending along a bottom surface of the core insulating layer; and
a memory layer extending along an outer wall of the channel layer, which faces the support structure and the stack structure.

13. The method of claim 12, further comprising, before the removing of the support structure:
removing a portion of the core insulating layer to define a recess region;
forming a doped semiconductor layer that fills the recess region, the doped semiconductor layer extending to cover the stack structure;
forming a metal layer on the doped semiconductor layer;
forming a first insulating layer that covers the metal layer; and
bonding a peripheral circuit structure to the first insulating layer.

14. The method of claim 13, further comprising:
removing the protective layer and the mask pattern;
forming an upper insulating layer that fills a space between the select lines, the upper insulating layer extending to cover the second part of each of the cell pillars;
forming a bit line contact that penetrates the upper insulating layer and the memory layer, the bit line contact being in contact with the channel layer; and
forming a bit line on the upper insulating layer to overlap with the peripheral circuit structure, the stack structure interposed between the bit line and the peripheral circuit structure.

15. The method of claim 12, wherein each of the cell pillars further includes a doped semiconductor pattern that overlaps with the core insulating layer, and
wherein the channel layer extends to cover a sidewall of the doped semiconductor pattern.

16. The method of claim 15, further comprising, before the removing of the support structure:
forming a first insulating layer that extends to cover the cell pillars and the stack structure;
forming a bit line contact that penetrates the first insulating layer, the bit line contact being in contact with the doped semiconductor pattern;
forming a bit line in contact with the bit line contact, the bit line extending onto the first insulating layer;
forming an interconnection structure that overlaps with the stack structure, the bit line interposed between the interconnection structure and the stack structure; and
bonding a peripheral circuit structure to the interconnection structure.

17. The method of claim 16, further comprising:
removing the protective layer and the mask pattern;
forming an upper insulating layer that fills a space between the select lines, the upper insulating layer extending to cover the second part of each of the cell pillars and the stack structure;
removing a portion of the upper insulating layer and a portion of the memory layer to expose the channel layer; and
forming a source layer that is connected to the channel layer, the source layer overlapping with the peripheral circuit structure, the stack structure, and the bit line, wherein the stack structure and the bit line are interposed between the source layer and the peripheral circuit structure.

* * * * *